United States Patent
Parvizi et al.

(10) Patent No.: US 10,554,453 B1
(45) Date of Patent: Feb. 4, 2020

(54) QUARTER-RATE CHARGE-STEERING DECISION FEEDBACK EQUALIZER (DFE)

(71) Applicants: Mahdi Parvizi, Kanata (CA); Jacob Pike, Almonte (CA); Naim Ben-Hamida, Nepean (CA); Sadok Aouini, Gatineau (CA); Calvin Plett, Ottawa (CA)

(72) Inventors: Mahdi Parvizi, Kanata (CA); Jacob Pike, Almonte (CA); Naim Ben-Hamida, Nepean (CA); Sadok Aouini, Gatineau (CA); Calvin Plett, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/379,502

(22) Filed: Apr. 9, 2019

(51) Int. Cl.
| H03H 7/30 | (2006.01) |
| H03H 7/40 | (2006.01) |
| H03K 5/159 | (2006.01) |
| H04L 25/03 | (2006.01) |
| H03K 3/356 | (2006.01) |

(52) U.S. Cl.
CPC ....... H04L 25/03063 (2013.01); H03K 3/356 (2013.01); *H04L 2025/03509* (2013.01)

(58) Field of Classification Search
CPC ..... H04L 25/03063; H04L 2025/03509; H04L 25/03057; H03K 3/356; H03F 3/45076
USPC ........................................ 375/229, 233, 232
See application file for complete search history.

(56) References Cited

U.S. PATENT DOCUMENTS

| 6,275,107 | B1 * | 8/2001 | Maeda | H03F 3/45076 |
| | | | | 330/253 |
| 9,106,461 | B2 * | 8/2015 | Parikh | H04L 25/03057 |
| 9,148,316 | B2 * | 9/2015 | Mukherjee | H04L 25/03057 |
| 9,531,570 | B2 * | 12/2016 | Hekmat | H04L 25/03057 |
| 2008/0310495 | A1 * | 12/2008 | Bulzacchelli | H04L 25/03057 |
| | | | | 375/233 |

(Continued)

OTHER PUBLICATIONS

Emami-Neyestanak, et al., "A 6.0-mW 10.0-Gb/s Receiver With Switched-Capacitor Summation DFE", IEEE Journal of Solid-State Circuits, vol. 42 (2007): pp. 889-896.

(Continued)

*Primary Examiner* — Phuong Phu
(74) *Attorney, Agent, or Firm* — Integral Intellectual Property Inc.; Miriam Paton; Amy Scouten

(57) ABSTRACT

A decision feedback equalizer (DFE) comprises four charge-steering (CS) primary latches and four primary taps. Two of the four CS primary latches are driven by complementary in-phase quarter-rate clocks and the other two of the four CS primary latches are driven by complementary quadrature quarter-rate clocks. No element of the DFE is driven by any half-rate clocks. In some implementations, each of the primary latches including a respective differential pair of n-channel output transistors and each primary tap includes a respective differential pair of p-channel input transistors connected via their gate nodes to a respective one of the four CS primary latches. In other implementations, each of the primary latches including a respective differential pair of p-channel input transistors and each primary tap includes a respective differential pair of n-channel output transistors connected via their gate nodes to a respective one of the four CS primary latches.

20 Claims, 19 Drawing Sheets

(56) References Cited

U.S. PATENT DOCUMENTS

| | | |
|---|---|---|
| 2016/0080178 A1 | 3/2016 | Chen et al. |
| 2016/0344576 A1 | 11/2016 | Francese |
| 2017/0264467 A1 | 9/2017 | Neto |
| 2017/0373889 A1 | 12/2017 | Sakai |
| 2018/0302070 A1 | 10/2018 | Parvizi et al. |

OTHER PUBLICATIONS

Frans, et al., "A 40-to-64Gb/s NRZ transmitter with supply-regulated front-end in 16nm FinFET", IEEE Journal of Solid-State Circuits, vol. 51, No. 12, Dec. 2016.

Fukuda, et al., "A 123-mW 12.5-Gb/s Complete Transceiver in 65-nm CMOS Process", IEEE Journal of Solid-State Circuits, vol. 45, No. 12, Dec. 2010.

Jung, et al., "A 25 Gb/s 5.8 mW CMOS Equalizer", IEEE Journal of Solid-State Circuits, vol. 50, No. 2, Feb. 2015.

Jung, "A 25-Gb/s 5-mW CDR/Deserializer in 65-nm Technology", UCLA Electronic Theses and Dissertations, 2012.

Jung, et al., "A 25-Gb/s 5-mW CMOS CDR/Deserializer", IEEE Journal of Solid-State Circuits, vol. 48, No. 3, Mar. 2013.

Jung, et al., "A 25-Gb/s 5-mW CMOS CDR/Deserializer", 2012 Symposium on VLSI Circuits Digest of Technical Papers, 138-139.

Lee, et al., "Design of 56 Gb/s NRZ and PAM4 SerDes Transceivers in CMOS Technologies", IEEE Journal of Solid-State Circuits, vol. 50, No. 9, Sep. 2015, 2061-2073.

Manian, et al., "A 32-Gb/s 9.3-mW CMOS Equalizer with 0.73-V Supply", Proceedings of the IEEE 2014 Custom Integrated Circuits Conference, Sep. 2014.

Manian, et al., "A 40Gb/s 14mW CMOS Wireline Receiver", 2016 IEEE International Solid-State Circuits Conference.

Manian, et al., "A 40-Gb/s 14-mW CMOS Wireline Receiver", IEEE Journal of Solid-State Circuits, vol. 52, No. 9, Sep. 2017.

Manian, et al., "A 40-Gb/s 9.2-mW CMOS Equalizer", 2015 Symposium on VLSI Circuits Digest of Technical Papers.

Manian, "Low-Power Techniques for CMOS Wireline Receivers", UCLA Electronic Theses and Dissertations, 2016.

Parikh, et al., "A 32Gb/s wireline receiver with a low-frequency equalizer, CTLE and 2-tap DFE in 28nm CMOS", Paper presented at the meeting of the ISSCC, 2013, 2013.

Pike, et al., "New Charge-Steering Latches in 28nm CMOS for Use in High-Speed Wireline Transceivers", 2018 IEEE International Symposium on Circuits and Systems (ISCAS), May 2018.

Razavi, "Charge Steering: A Low-Power Design Paradigm", Proceedings of the IEEE 2013 Custom Integrated Circuits Conference (2013): 1-8.

Toifl, et al., "A 2.6 mW/Gbps 12.5 Gbps RX With 8-Tap Switched-Capacitor DFE in 32 nm CMOS", IEEE Journal of Solid-State Circuits, vol. 47, Issue 4, Apr. 2012.

Turker, et al., "Design techniques for 32.75Gb/s and 56Gbis wireline transceivers in 16nm FinFET", 2017 IEEE Compound Semiconductor Integrated Circuit Symposium (CSICS), Oct. 2017.

Wong, et al., "A 5-mW 6-Gb/s Quarter-Rate Sampling Receiver With a 2-Tap DFE Using Soft Decisions", IEEE Journal of Solid-State Circuits, vol. 42, No. 4, Apr. 2007.

Pike et al., U.S. Appl. No. 16/203,101, filed Nov. 28, 2018.

Puente, "Notice of Allowance for U.S. Appl. No. 16/203,101", dated Sep. 5, 2019.

\* cited by examiner

½-RATE CS LATCH

US 10,554,453 B1

QUARTER-RATE CHARGE-STEERING DECISION FEEDBACK EQUALIZER (DFE)

TECHNICAL FIELD

This document relates to the technical field of decision feedback equalizers (DFEs).

BACKGROUND

As data is transmitted over a channel from a serializer device to a deserializer device, loss in the channel results in the amplitude being attenuated and inter-symbol interference (ISI). These issues are exacerbated as data transmission speeds increase.

An important element of the deserializer device is a decision feedback equalizer (DFE). A DFE processes an input stream $D_{IN}$ of data to yield an output stream $D_{OUT}$ of data. The input stream $D_{IN}$ represents input bits $\{b_1, b_2, b_3, \ldots\}$, and the output stream $D_{OUT}$ represents output bits $\{B_1, B_2, B_3, \ldots\}$. To compensate for the ISI, the DFE adjusts each input bit using N previous output bits to yield the corresponding output bit, where N is a positive integer. Mathematically, this is expressed as $$B_{N+1} = b_{N+1} + \sum_{k=1}^{N} \alpha_k B_k$$

where the coefficients $\alpha_k$ express the strength of the contribution of the kth previous output bit $B_k$ to the adjustment.

More specifically, the DFE adjusts the voltages representing each input bit by the voltages representing N previous output bits to yield voltages representing the corresponding output bit.

N latches of the DFE store the N previous output bits. Each one of N taps determines the coefficient $\alpha$ that expresses the strength of the adjustment contributed by a corresponding one of the previous output bits. A summing node of the DFE samples the input bit and adds the adjustments to the sampled input bit.

It is common to implement the latches of a DFE using current mode logic (CML). K-L J. Wong, A. Rylyakov, and C-K K. Yang, "A 5-mW 6-Gb Quarter-Rate Sampling Receiver With a 2-Tap DFE Using Soft Decisions", *IEEE Journal of Solid-State Circuits*, vol. 42, no. 4, April 2007 describes using a quarter-rate CML-based DFE to make clock generation and distribution simpler.

B. Ravazi has shown in "Charge Steering: A Low-Power Design Paradigm", *Custom Integrated Circuits Conference*, pp. 1-8, September 2013 that latches based on charge-steering (CS) techniques demonstrate power savings of approximately 4.4 times the CML latches.

The CS equalizers described in A. Manian and B. Razavi, "A 40-Gb/s 14-mW CMOS Wireline Receiver", *IEEE Journal of Solid-State Circuits, vol.* 52, no. 9, September 2017, require extensive distribution of half-rate clocks, which make their design inappropriate for pushing data transmission speeds.

SUMMARY

A decision feedback equalizer (DFE), suitable for use in a deserializer device, processes an input stream $D_{IN}$ of data to yield an output stream $D_{OUT}$ of data. The DFE comprises charge-steering (CS) latches, each driven by a respective ¼-rate clock. No element of the DFE is driven by any ½-rate clock. Example one-tap ¼-rate CS DFEs and two-tap ¼-rate CS DFEs are discussed in detail. Example circuit diagrams of taps for use in the DFE are presented. The absence of any ½-rate clock makes layout and routing of clocks significantly easier compared to a previous CS DFE. Simulations demonstrate the power savings achievable by the DFEs described in this document compared to a previous CS DFE and compared to a previous current mode logic (CML) DFE.

DETAILED DESCRIPTION

Figure 1:
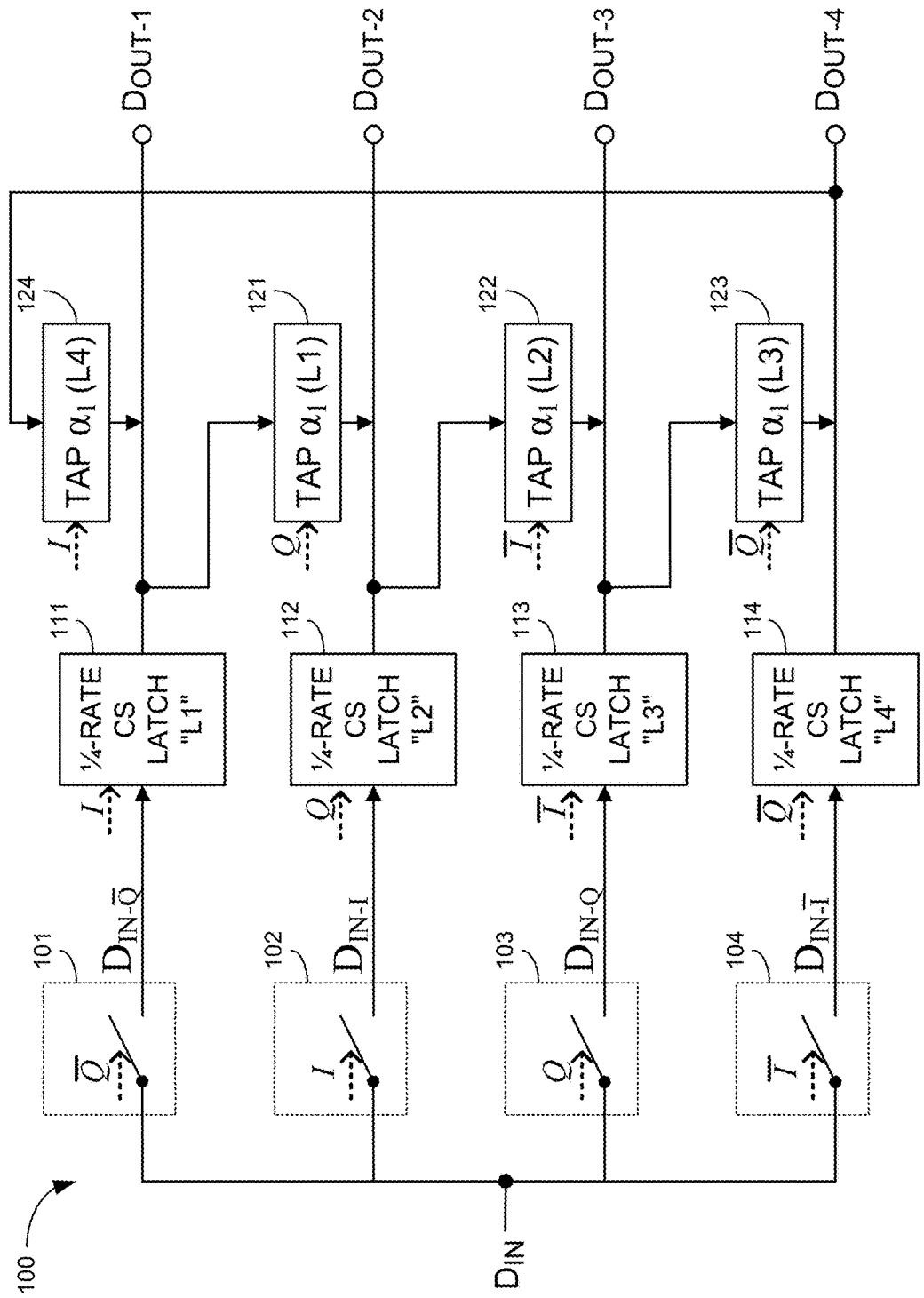
FIG. 1 is a schematic diagram of an example one-tap ¼-rate charge-steering (CS) decision feedback equalizer (DFE)
Figure 2:
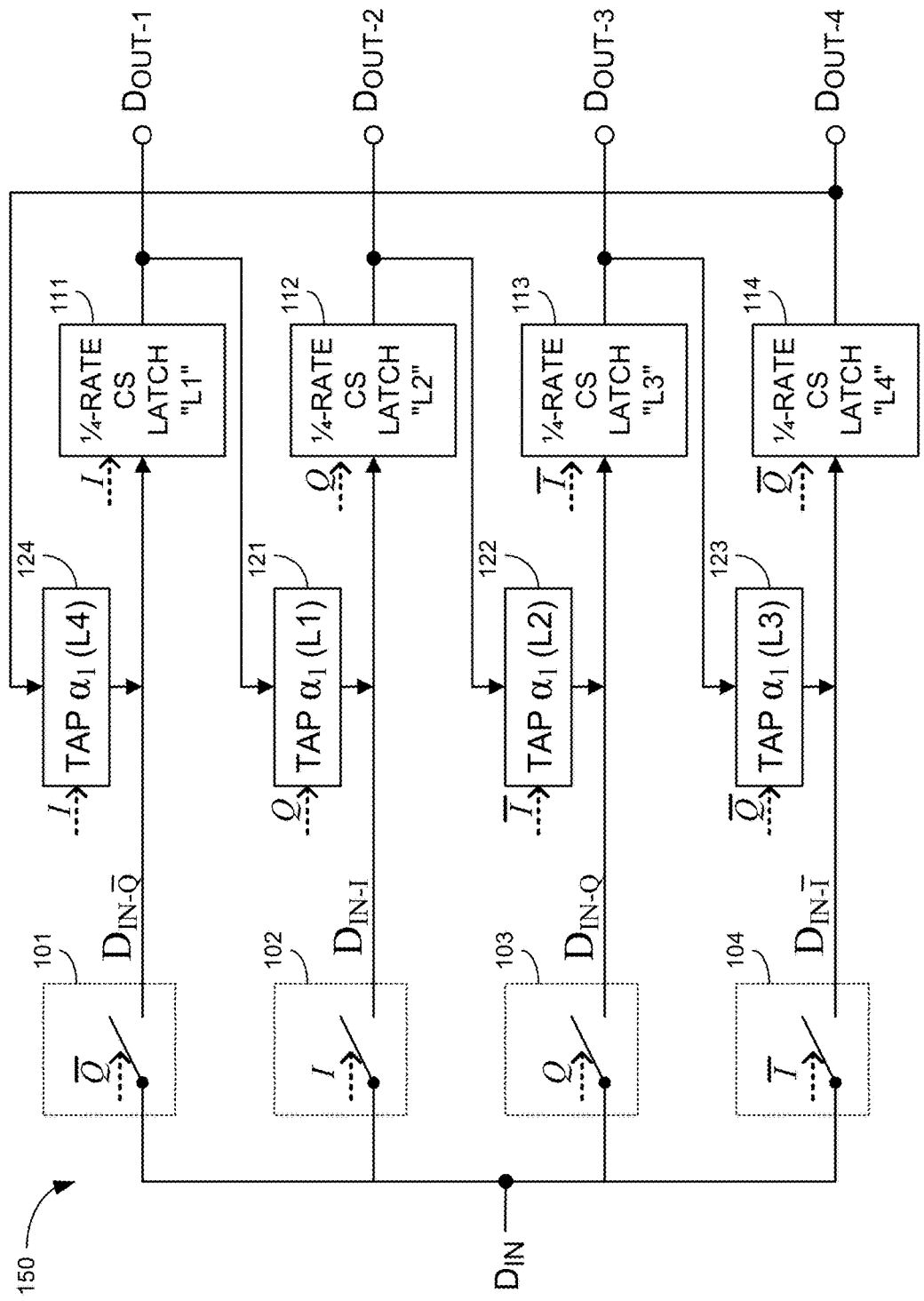
FIG. 2 is a schematic diagram of another example one-tap ¼-rate CS DFE.
Figure 3:
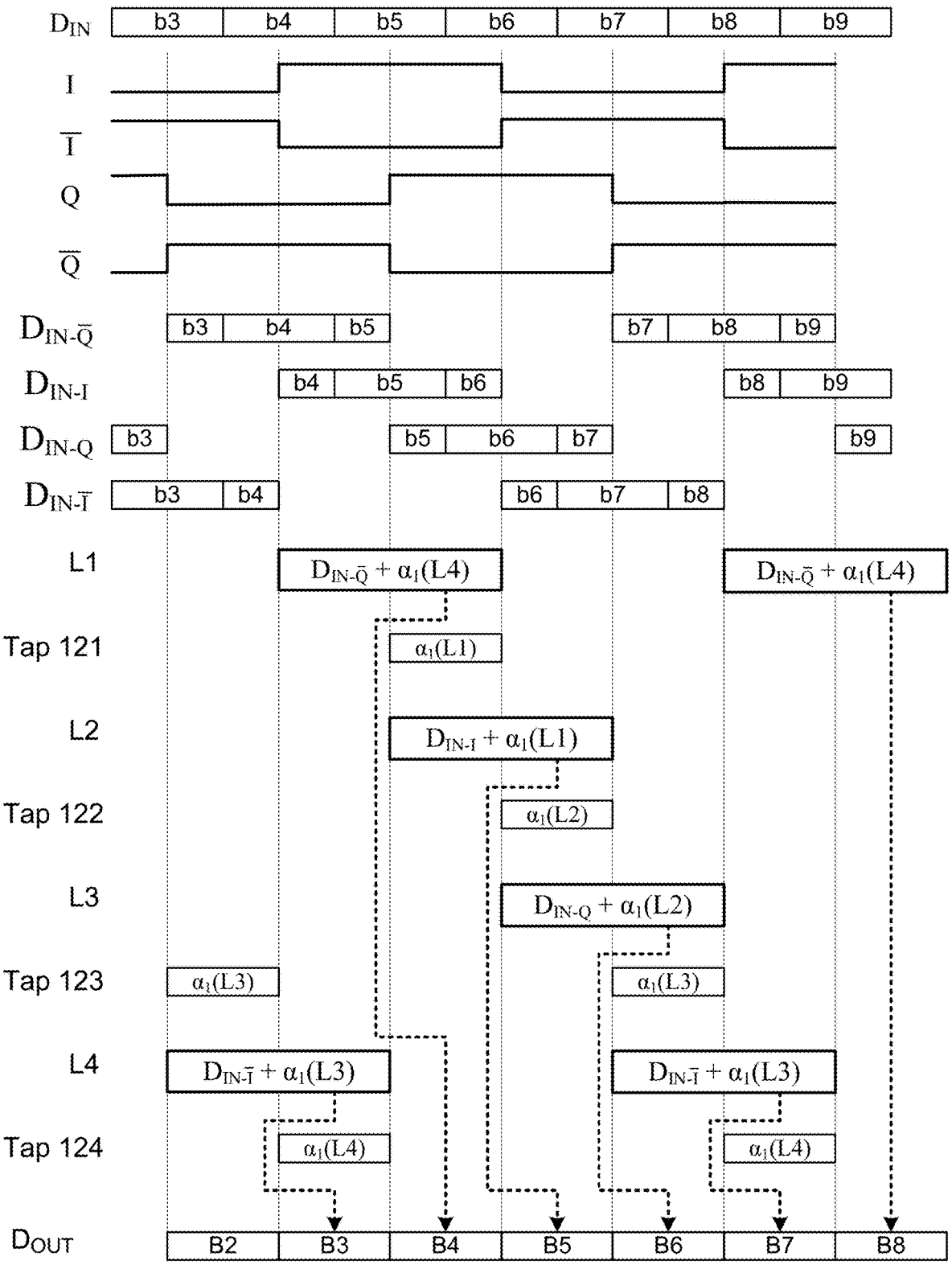
FIG. 3 and FIG. 4 are example timing diagrams of an input data stream, an output data stream, various ¼-rate clocks, and the state of various elements in the example one-tap ¼-rate CS DFEs of FIG. 1 and FIG. 2.
Figure 4:
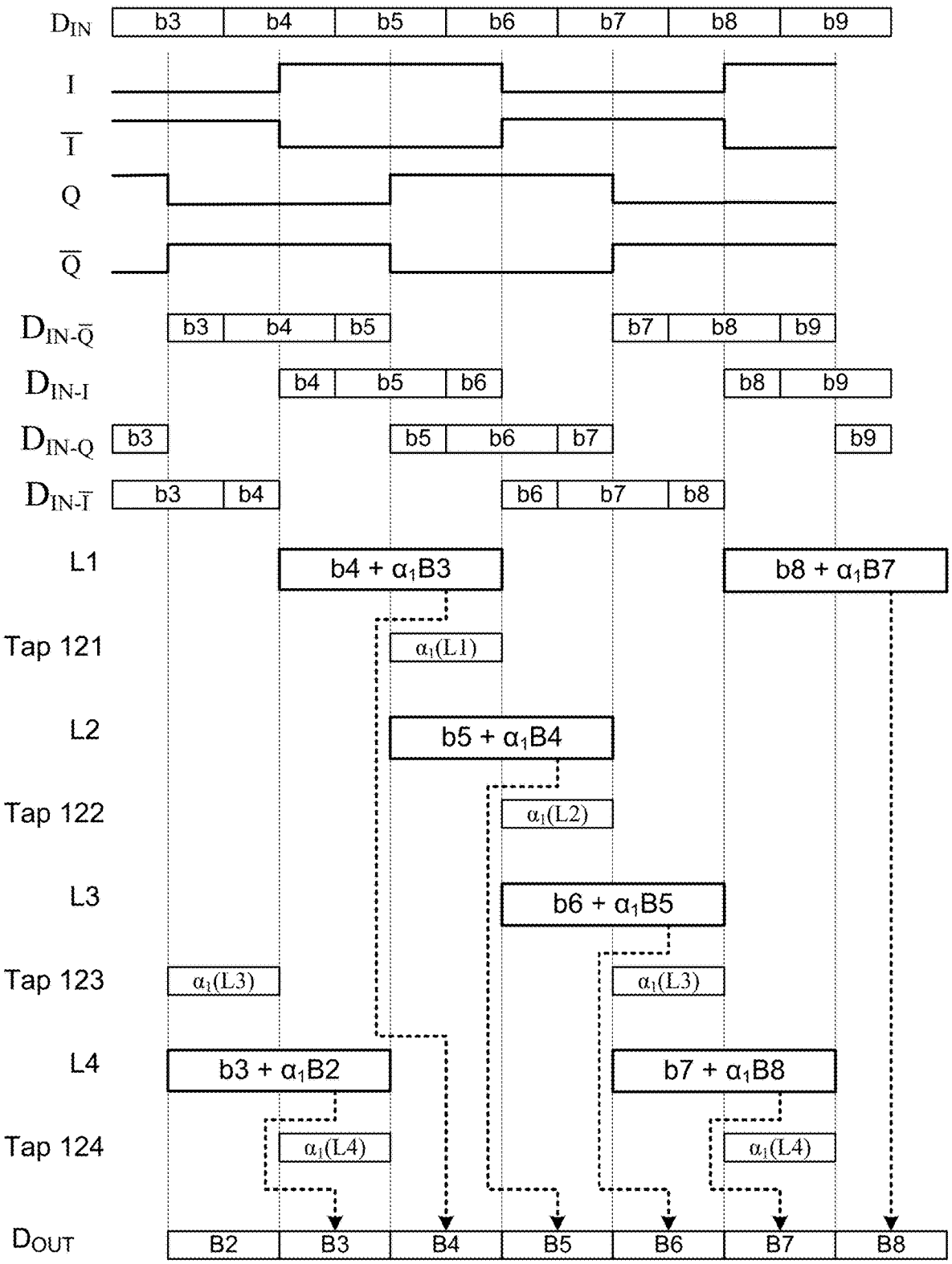

FIG. 1 is a schematic diagram of an example one-tap ¼-rate charge-steering (CS) decision feedback equalizer (DFE) 100. FIG. 2 is a schematic diagram of another example one-tap ¼-rate CS DFE 150. FIG. 3 and FIG. 4 are example timing diagrams of an input data stream, an output data stream, various ¼-rate clocks, and the state of various elements in the DFE 100 and in the DFE 150.

The DFE 100, 150 comprises multiple charge-steering (CS) latches. Each CS latch is driven by a clock. The CS latch is in its reset mode when the clock that drives the CS latch is low, and the CS latch is in its evaluation mode and samples its input and holds the sampled value when the clock that drives the CS latch is high.

An analog input data stream $D_{IN}$ conveys data at a data rate R, for example, at 56 Gb/s or at 112 Gb/s or higher. Components of the DFE 100, 150 are driven by clocks. Input data has a data rate given in bits per second, but its highest possible frequency component, given in Hertz, is half the data rate. A ½-rate clock is the same speed as the data rate if there is a transition every bit. A ¼-rate clock is twice as slow as the data rate. Stated differently, if a data rate represents different data at a max frequency f, then a ½-rate clock changes its state at the frequency f and a ¼-rate clock changes its state at the frequency ½f.

The following clocks are employed: an in-phase ¼-rate clock labeled I, a quadrature ¼-rate clock labeled Q that is 90° out of phase with I, a ¼-rate clock labeled $\bar{I}$ that is complementary to I, and a ¼-rate clock labeled $\bar{Q}$ that is complementary to Q. When the clock I is high, the clock $\bar{I}$ is low, and vice versa. When the clock Q is high, the clock $\bar{Q}$ is low, and vice versa. Stated differently, the clock $\bar{I}$ is 180° out of phase with I, and the clock $\bar{Q}$ is 180° out of phase with Q.

Figure 13:
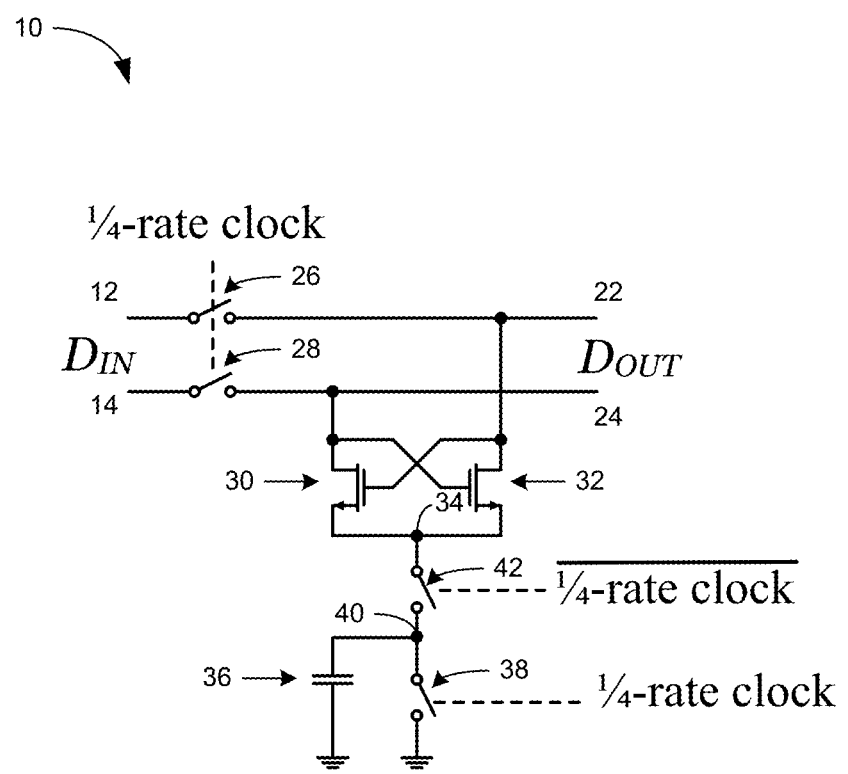
FIG. 13 is an example circuit diagram of a non-return-to-zero (NRZ) CS latch.

The DFE 100, 150 comprises four circuits 101, 102, 103, and 104 to perform a 1:4 demultiplexing (DEMUX) of the input data stream $D_{IN}$, thereby creating four input data streams labeled $D_{IN-\bar{Q}}$, $D_{IN-I}$, $D_{IN-Q}$, and $D_{IN-\bar{I}}$, respectively. The input data stream $D_{IN-\bar{Q}}$ overlaps the input data stream $D_{IN-I}$ by 50%. The input data stream $D_{IN-I}$ overlaps the input data stream $D_{IN-Q}$ by 50%. The input data stream $D_{IN-Q}$ overlaps the input data stream $D_{IN-\bar{I}}$ by 50%. The input data stream $D_{IN-\bar{I}}$ overlaps the input data stream $D_{IN-\bar{Q}}$ by 50%. As illustrated in FIG. 1 and in FIG. 2, the circuits 101, 102, 103, and 104 may be implemented as simple switches driven by the clocks $\bar{Q}$, I, Q, and $\bar{I}$, respectively. Alternatively, the circuits 101, 102, 103, and 104 may be implemented as track-and-hold circuits, such as a non-return-to-zero (NRZ) charge-steering latch, an example of which is illustrated in FIG. 13.

As illustrated in FIG. 3 and FIG. 4, if the input data stream $D_{IN}$ represents bit values denoted $\{b_1, b_2, b_3, \ldots\}$, then each of the four input data streams successively represents three consecutive bit values.

The DFE 100, 150 comprises four ¼-rate CS latches 111 through 114 (labeled "L1" through "L4", respectively). In this document, the latches L1 through L4 are referred to as "primary latches".

The primary latch L1 is driven by I. In the first half of I being high, which overlaps with $\bar{Q}$ being high, the primary latch L1 samples the input data stream $D_{IN-\bar{Q}}$ and latches onto the first bit value that is seen at its input. In the second half of I being high, which overlaps with Q being low, the primary latch L1 holds the value that it sampled in the first half.

The primary latch L2 is driven by Q. In the first half of Q being high, which overlaps with I being high, the primary latch L2 samples the input data stream $D_{IN-I}$ and latches onto the first bit value that is seen at its input. In the second half of Q being high, which overlaps with I being low, the primary latch L2 holds the value that it sampled in the first half.

The primary latch L3 is driven by $\bar{I}$. In the first half of $\bar{I}$ being high, which overlaps with Q being high, the primary latch L3 samples the input data stream $D_{IN-Q}$ and latches onto the first bit value that is seen at its input. In the second half of $\bar{I}$ being high, which overlaps with Q being low, the primary latch L3 holds the value that it sampled in the first half.

The primary latch L4 is driven by $\bar{Q}$. In the first half of $\bar{Q}$ being high, which overlaps with $\bar{I}$ being high, the primary latch L4 samples the input data stream $D_{IN-\bar{I}}$ and latches onto the first bit value that is seen at its input. In the second half of $\bar{Q}$ being high, which overlaps with $\bar{I}$ being low, the primary latch L4 holds the value that it sampled in the first half.

In the DFE 100, the outputs of the primary latches L1, L2, L3, and L4 are affected by primary taps 124, 121, 122, and 123, respectively. In the DFE 150, the inputs of the primary latches L1, L2, L3, and L4 are affected by primary taps 124, 121, 122, and 123, respectively. The primary taps 121, 122, 123, and 124 are characterized by a real-valued coefficient $\alpha_1$.

The primary tap 121 is coupled to the output of the primary latch L1. When I is high, the primary tap 121 provides a product of the coefficient $\alpha_1$ and the value held in the primary latch L1. In the DFE 100, when Q is high, the primary tap 121 contributes to the output of the primary latch L2. In the DFE 150, when Q is high, the primary tap 121 contributes to the input of the primary latch L2. That is, L2=$D_{IN-I}+\alpha_1$L1. When Q is high and $\bar{I}$ is high, the output of the primary latch L2 becomes part of the output data stream $D_{OUT-2}$.

The primary tap 122 is coupled to the output of the primary latch L2. When Q is high, the primary tap 122 provides a product of the coefficient $\alpha_1$ and the value held in the primary latch L2. In the DFE 100, when $\bar{I}$ is high, the primary tap 122 contributes to the output of the primary latch L3. In the DFE 150, when $\bar{I}$ is high, the primary tap 122 contributes to the input of the primary latch L3. That is, L3=$D_{IN-Q}+\alpha_1$L2. When $\bar{I}$ is high and $\bar{Q}$ is high, the output of the primary latch L3 becomes part of the output data stream $D_{OUT-3}$.

The primary tap 123 is coupled to the output of the primary latch L3. When $\bar{I}$ is high, the primary tap 123 provides a product of the coefficient $\alpha_1$ and the value held in the primary latch L3. In the DFE 100, when $\bar{Q}$ is high, the primary tap 123 contributes to the output of the primary latch L4. In the DFE 150, when $\bar{Q}$ is high, the primary tap 123 contributes to the input of the primary latch L4. That is, L4=$D_{IN-\bar{I}}+\alpha_1$L3. When $\bar{Q}$ is high and I is high, the output of the primary latch L4 becomes part of the output data stream $D_{OUT-4}$.

The primary tap 124 is coupled to the output of the primary latch L4. When $\bar{Q}$ is high, the primary tap 124 provides a product of the coefficient $\alpha_1$ and the value held in the primary latch L4. In the DFE 100, when I is high, the primary tap 124 contributes to the output of the primary latch L1. In the DFE 150, when I is high, the primary tap 124 contributes to the input of the primary latch L1. That is, L1=$D_{IN-\bar{Q}}+\alpha_1$L4. When is high and Q is high, the output of the primary latch L1 becomes part of the output data stream $D_{OUT-1}$.

If the input data stream $D_{IN}$ represents bit values denoted $\{b_1, b_2, b_3, \ldots\}$, the output data stream $D_{OUT}$ comprised of the output data streams $D_{OUT-1}$, $D_{OUT-2}$, $D_{OUT-3}$, and $D_{OUT-4}$ represents bit values denoted $\{B_1, B_2, B_3, \ldots\}$. The relationship between the input bit values and output bit values is summarized in Table 1:

TABLE 1

| Input Bit Value | Output Bit Value |
|---|---|
| $b_1$ | $B_1 = b_1$ |
| $b_2$ | $B_2 = b_2 + \alpha_1 B_1$ |
| $b_3$ | $B_3 = b_3 + \alpha_1 B_2$ |
| $b_4$ | $B_4 = b_4 + \alpha_1 B_3$ |
| $b_5$ | $B_5 = b_5 + \alpha_1 B_4$ |
| $b_6$ | $B_6 = b_6 + \alpha_1 B_5$ |
| $b_7$ | $B_7 = b_7 + \alpha_1 B_6$ |
| $b_8$ | $B_8 = b_8 + \alpha_1 B_7$ |

The DFE 100 and the DFE 150 are both denoted a one-tap CS DFE because each output bit value $B_{k+1}$ is the input value $b_{k+1}$ adjusted by the nearest previous output bit value $B_k$. The coefficient $\alpha_1$ applied by the primary taps 121, 122, 123, and 124 expresses the strength of the adjustment that the nearest previous adjusted bit value has on the bit value currently being adjusted. For a given channel, it is expected that the coefficient $\alpha_1$ is constant or slowly varying (relative to the data rate).

As described above and clearly illustrated in FIG. 1 and FIG. 2, in the DFE 100 the taps directly alter the output of the primary latches, whereas in the DFE 150 the taps directly alter the input of the primary latches. Use of the topology of the DFE 150 to alter directly the input of the primary latches may make it possible to apply the tap coefficients more efficiently, which may result in smaller tail capacitors and power savings.

Figure 5:
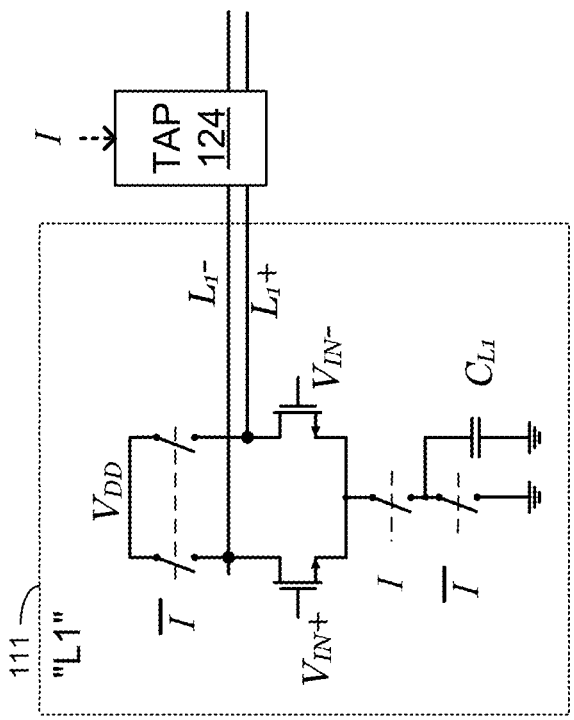
FIG. 5 is a partial circuit diagram of a quarter path of the example one-tap ¼-rate CS DFE illustrated in FIG. 1.

FIG. 5 is a partial circuit diagram of a quarter path of the DFE 100. FIG. 5 illustrates example circuitry of the primary latch L1. A similar partial circuit diagram could be drawn for the quarter path of the DFE 100 that includes the primary latch L2 and the primary tap 121, or for the quarter path of the DFE 100 that includes the primary latch L3 and the primary tap 122, or for the quarter path of the DFE 100 that includes the primary latch L4 and the primary tap 123.

The primary latch L1 comprises a differential pair of n-channel output transistors, a pair of switches driven by $\bar{I}$, an evaluation switch driven by I, a reset switch driven by $\bar{I}$, and a capacitor having capacitance $C_{L1}$. The pair of switches are connected between drain nodes of the n-channel output transistors and a first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential representation of a bit value provided by the input data stream $D_{IN-\bar{Q}}$. The drain nodes of the n-channel output transistors are connected to a differential pair of output nodes (labeled "$L_1+$" and "$L_1-$") of the primary latch L1, which is then adjusted by the primary tap 124.

Figure 6:
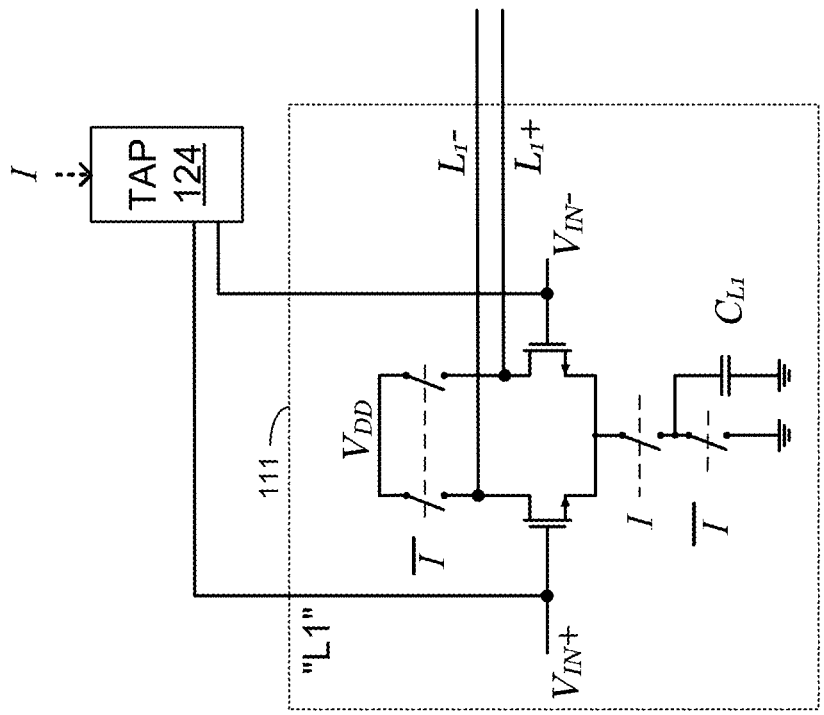
FIG. 6 is a partial circuit diagram of a quarter path of the example one-tap ¼-rate CS DFE illustrated in FIG. 2.

FIG. 6 is a partial circuit diagram of a quarter path of the DFE 150. FIG. 6 illustrates example circuitry of the primary latch L1. A similar partial circuit diagram could be drawn for the quarter path of the DFE 150 that includes the primary latch L2 and the primary tap 121, or for the quarter path of the DFE 150 that includes the primary latch L3 and the primary tap 122, or for the quarter path of the DFE 150 that includes the primary latch L4 and the primary tap 123.

The primary latch L1 comprises a differential pair of n-channel output transistors, a pair of switches driven by $\bar{I}$, an evaluation switch driven by I, a reset switch driven by $\bar{I}$, and a capacitor having capacitance $C_{L1}$. The pair of switches are connected between drain nodes of the n-channel output transistors and a first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential representation of a bit value provided by the input data stream $D_{IN-\bar{Q}}$, as adjusted by the primary tap 124. The drain nodes of the n-channel output transistors are connected to a differential pair of output nodes (labeled "$L_1+$" and "$L_1-$") of the primary latch L1.

Figure 7:
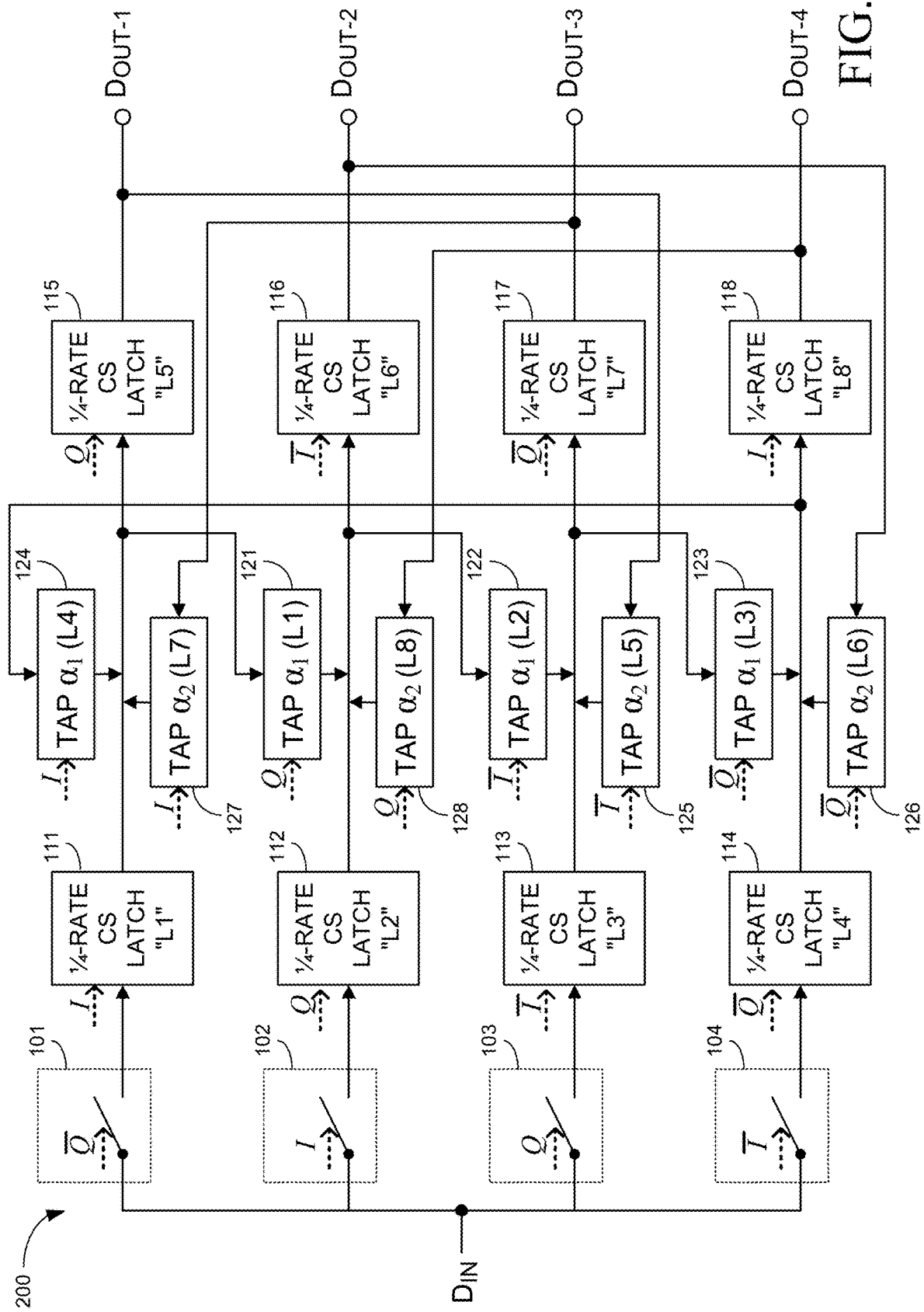
FIG. 7 is a schematic diagram of an example two-tap ¼-rate CS DFE.
Figure 8:
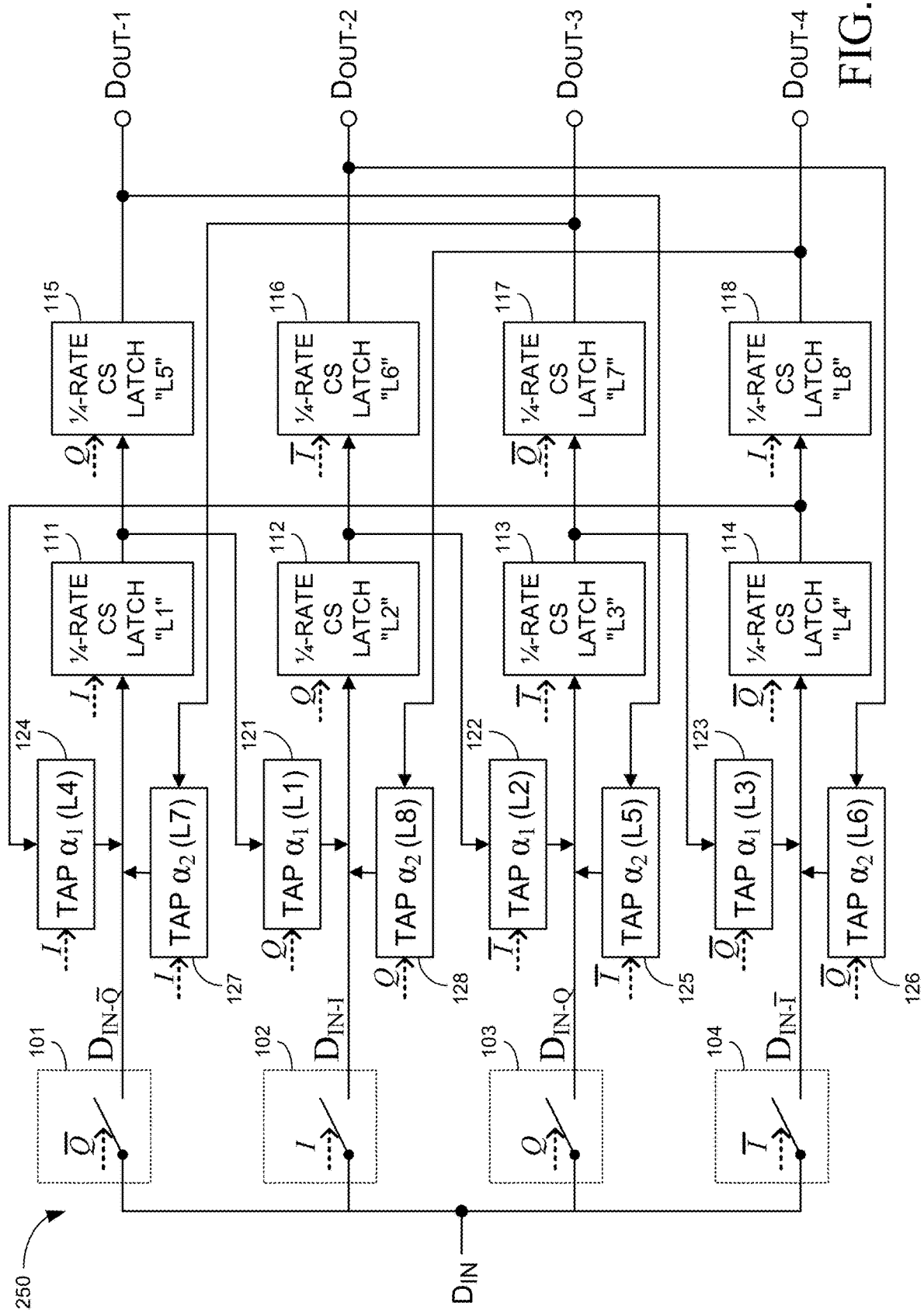
FIG. 8 is a schematic diagram of another example two-tap ¼-rate CS DFE.
Figure 9:
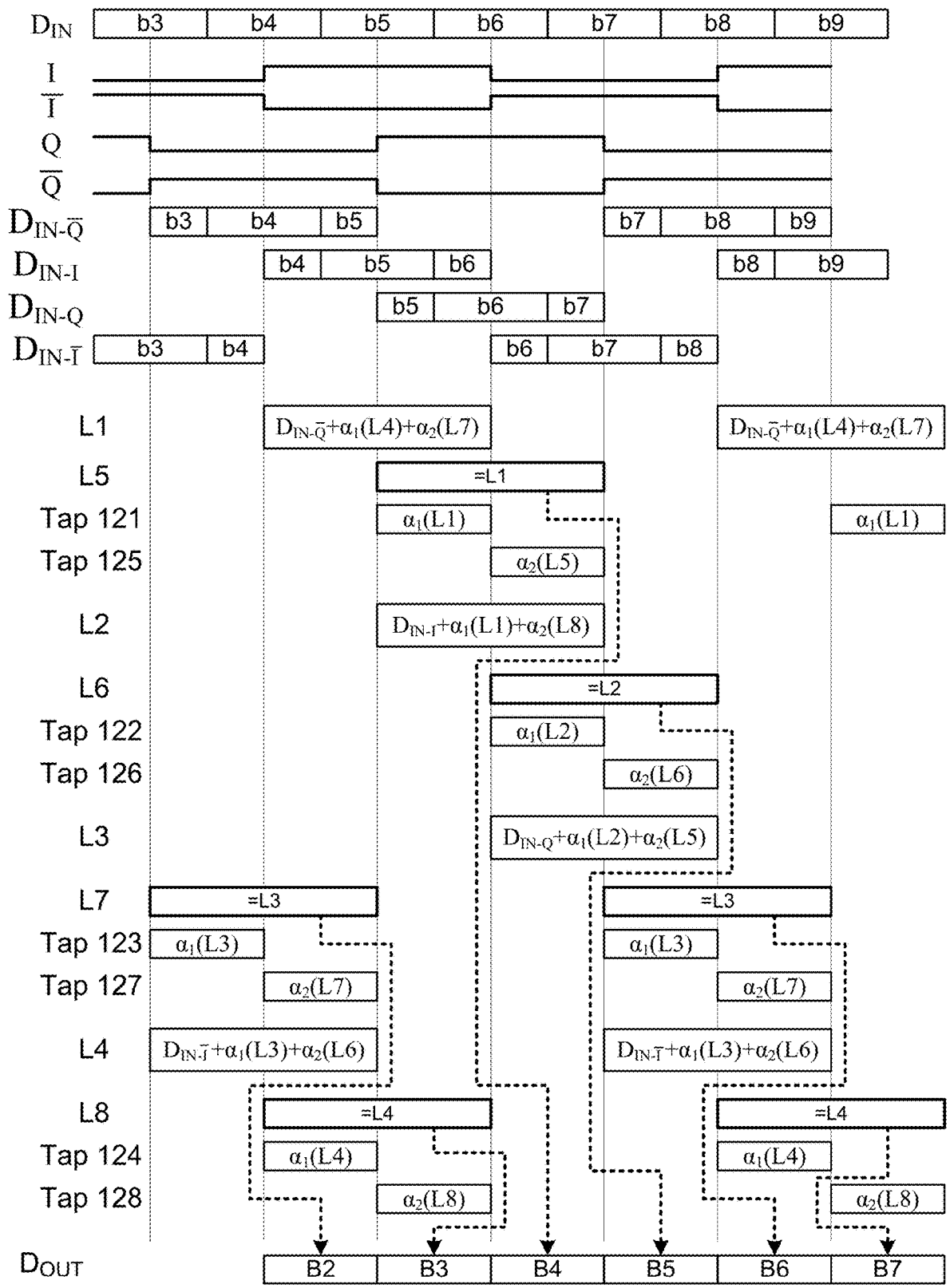
FIG. 9 and FIG. 10 are example timing diagrams of an input data stream, an output data stream, various ¼-rate clocks, and the state of various elements in the example two-tap ¼-rate CS DFEs of FIG. 7 and FIG. 8.
Figure 10:
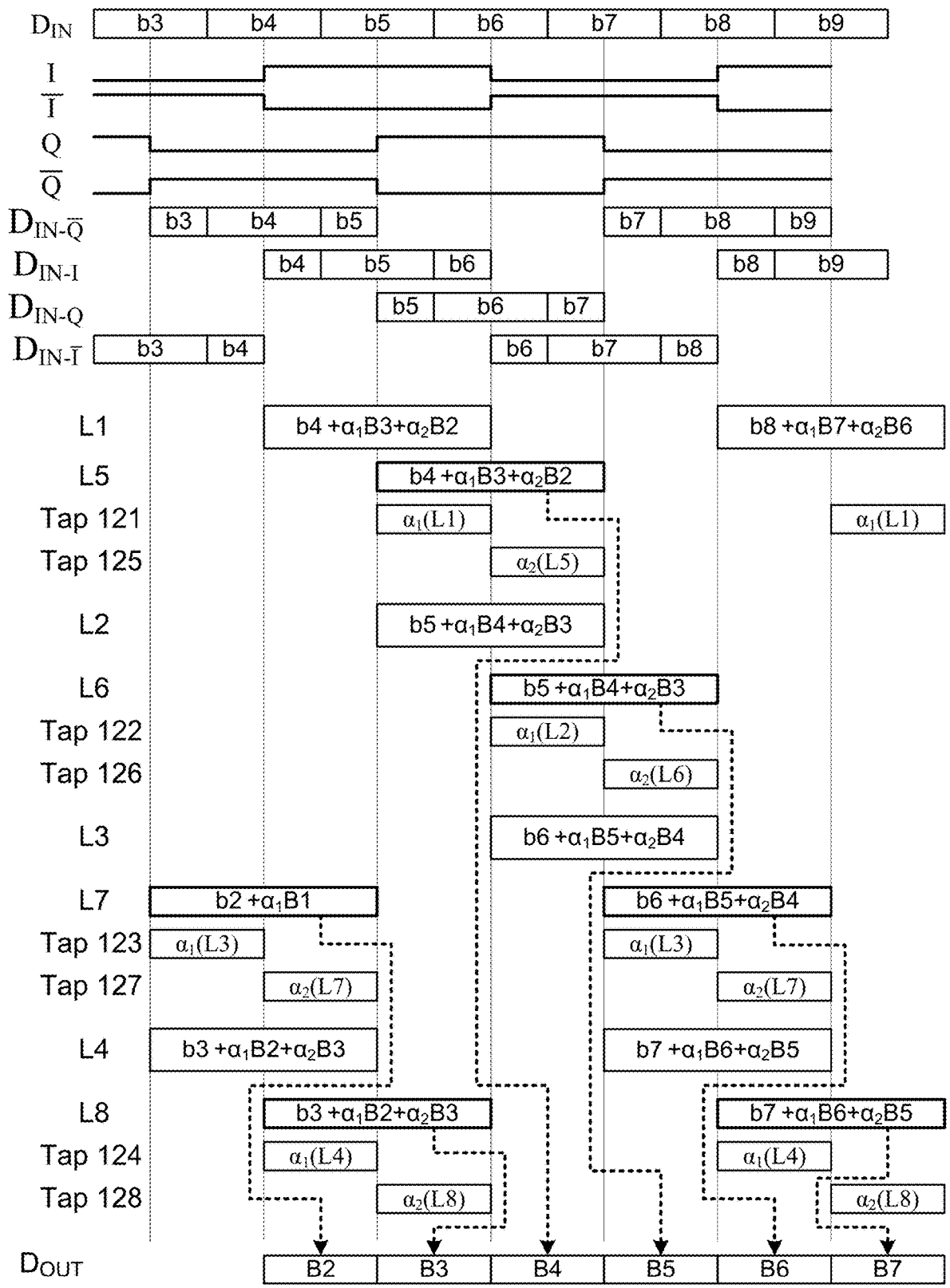

FIG. 7 is a schematic diagram of an example two-tap ¼-rate CS DFE 200. FIG. 8 is a schematic diagram of another example two-tap ¼-rate CS DFE 250. FIG. 9 and FIG. 10 are example timing diagrams of an input data stream, an output data stream, various ¼-rate clocks, and the state of various elements in the DFE 200 and in the DFE 250.

The DFE 200, 250 comprises all of the same components as the DFE 100, 150 as well as additional components. Components of the DFE 200, 250 are driven by the same clocks that as in the DFE 100, 150. The DFE 200, 250 handles the same input data stream $D_{IN}$ as the DFE 100, 150.

The DFE 200, 250 comprises eight ¼-rate CS latches 111 through 118 (labeled "L1" through "L8", respectively). In this document, the latches L1 through L4 are referred to as "primary latches" and the latches L5 through L8 are referred to as "secondary latches".

The secondary latch L5 is driven by Q and samples the value held in the primary latch L1 when Q is high. The secondary latch L6 is driven by $\bar{I}$ and samples the value held in the primary latch L2 when $\bar{I}$ is high. The secondary latch L7 is driven by $\bar{Q}$ and samples the value held in the primary latch L3 when $\bar{Q}$ is high. The secondary latch L8 is driven by I, and samples the value held in the primary latch L4 when I is high.

In the DFE 200, the outputs of the primary latches L1, L2, L3, and L4 are affected by the primary taps 124, 121, 122, and 123, respectively, and by secondary taps 127, 128, 125, and 126, respectively. The primary taps 121, 122, 123, and 124 are characterized by the real-valued coefficient $\alpha_1$. The secondary taps 125, 126, 127, and 128 are characterized by a real-valued coefficient $\alpha_2$.

The primary tap 121 is coupled to the output of the primary latch L1, and the secondary tap 128 is coupled to the output of the secondary latch L8. When I is high, the primary tap 121 provides a product of the coefficient $\alpha_1$ and the value held in the primary latch L1, and the secondary tap 128 provides a product of the coefficient $\alpha_2$ and the value held in the secondary latch L8. In the DFE 200, when Q is high, the primary tap 121 and the secondary tap 128 contribute to the output of the primary latch L2. In the DFE 250, when Q is high, the primary tap 121 and the secondary tap 128 contribute to the input of the primary latch L2. That is, L2= $D_{IN-1}+\alpha_1 L1+\alpha_2 L8$.

The primary tap 122 is coupled to the output of the primary latch L2, and the secondary tap 125 is coupled to the output of the secondary latch L5. When Q is high, the primary tap 122 provides a product of the coefficient $\alpha_1$ and the value held in the primary latch L2, and the secondary tap 125 provides a product of the coefficient $\alpha_2$ and the value held in the secondary latch L5. In the DFE 200, when $\bar{I}$ is high, the primary tap 122 and the secondary tap 125 contribute to the output of the primary latch L3. In the DFE 250, when $\bar{I}$ is high, the primary tap 122 and the secondary tap 125 contribute to the input of the primary latch L3. That is, L3=$D_{IN-Q}$+$\alpha_1$L2+$\alpha_2$L5.

The primary tap 123 is coupled to the output of the primary latch L3, and the secondary tap 126 is coupled to the output of the secondary latch L6. When $\bar{I}$ is high, the primary tap 123 provides a product of the coefficient $\alpha_1$ and the value held in the primary latch L3, and the secondary tap 126 provides a product of the coefficient $\alpha_2$ and the value held in the secondary latch L6. In the DFE 200, when $\bar{Q}$ is high, the primary tap 123 and the secondary tap 126 contribute to the output of the primary latch L4. In the DFE 250, when $\bar{Q}$ is high, the primary tap 123 and the secondary tap 126 contribute to the input of the primary latch L4. That is, L4= $D_{IN-\bar{I}}$+$\alpha_1$L3+$\alpha_2$L6.

The primary tap 124 is coupled to the output of the primary latch L4, and the secondary tap 127 is coupled to the output of the secondary latch L7. When $\bar{Q}$ is high, the primary tap 124 provides a product of the coefficient $\alpha_1$ and the value held in the primary latch L4, and the secondary tap 127 provides a product of the coefficient $\alpha_2$ and the value held in the secondary latch L7. In the DFE 200, when I is high, the primary tap 124 and the secondary tap 127 contribute to the output of the primary latch L1. In the DFE 250, when I is high, the primary tap 124 and the secondary tap 127 contribute to the input of the primary latch L1. That is, L1=$D_{IN-\bar{Q}}$+$\alpha_1$L4+$\alpha_2$L7.

The DFE 200 is denoted a two-tap CS DFE because at any given time, two taps contribute to the output of a primary latch. The DFE 250 is denoted a two-tap CS DFE because at any given time, two taps contribute to the input of a primary latch.

When I is high and Q is high, the output of the primary latch L1 is captured by the secondary latch L5 and consequently becomes part of the output data stream $D_{OUT-1}$.

When Q is high and $\bar{I}$ is high, the output of the primary latch L2 is captured by the secondary latch L6 and consequently becomes part of the output data stream $D_{OUT-2}$.

When $\bar{I}$ is high and $\bar{Q}$ is high, the output of the primary latch L3 is captured by the secondary latch L7 and consequently becomes part of the output data stream $D_{OUT-3}$.

When $\bar{Q}$ is high and I is high, the output of the primary latch L4 is captured by the secondary latch L8 and consequently becomes part of the output data stream $D_{OUT-4}$.

If the input data stream $D_{IN}$ represents bit values denoted $\{b_1, b_2, b_3, \ldots\}$, the output data stream $D_{OUT}$ comprised of the output data streams $D_{OUT-1}$, $D_{OUT-2}$, $D_{OUT-3}$, and $D_{OUT-4}$ represents bit values denoted $\{B_1, B_2, B_3, \ldots\}$. The relationship between the input bit values and output bit values is summarized in Table 2:

TABLE 2

| Input Bit Value | Output Bit Value |
| --- | --- |
| $b_1$ | $B_1 = b_1$ |
| $b_2$ | $B_2 = b_2 + \alpha_1 B_{1I}$ |
| $b_3$ | $B_3 = b_3 + \alpha_1 B_{2I} + \alpha_2 B_{1F}$ |
| $b_4$ | $B_4 = b_4 + \alpha_1 B_{3I} + \alpha_2 B_{2F}$ |
| $b_5$ | $B_5 = b_5 + \alpha_1 B_{4I} + \alpha_2 B_{3F}$ |
| $b_6$ | $B_6 = b_6 + \alpha_1 B_{5I} + \alpha_2 B_{4F}$ |
| $b_7$ | $B_7 = b_7 + \alpha_1 B_{6I} + \alpha_2 B_{5F}$ |
| $b_8$ | $B_8 = b_8 + \alpha_1 B_{7I} + \alpha_2 B_{6F}$ |
| ... | ... | where $B_{XI}$ represents the output from a primary latch captured by one of the primary taps and $B_{XF}$ represents the output from a secondary latch captured by one of the secondary taps.

The DFE 200, 250 is denoted a two-tap CS DFE because each output bit value $B_{k+2}$ is the input value $b_{k+2}$ adjusted by the nearest previous output bit value $B_{k+1}$ and by the next-nearest previous output bit value $B_k$. The coefficient $\alpha_1$ applied by the primary taps 121, 122, 123, and 124 expresses the strength of the adjustment that the nearest previous adjusted bit value has on the bit value currently being adjusted. The coefficient $\alpha_2$ applied by the secondary taps 125, 126, 127, and 128 expresses the strength of the adjustment that the next-nearest previous adjusted bit value has on the bit value currently being adjusted. It is expected that the coefficients $\alpha_1$ and $\alpha_2$ are constant or slowly varying (relative to the data rate).

Figure 11:
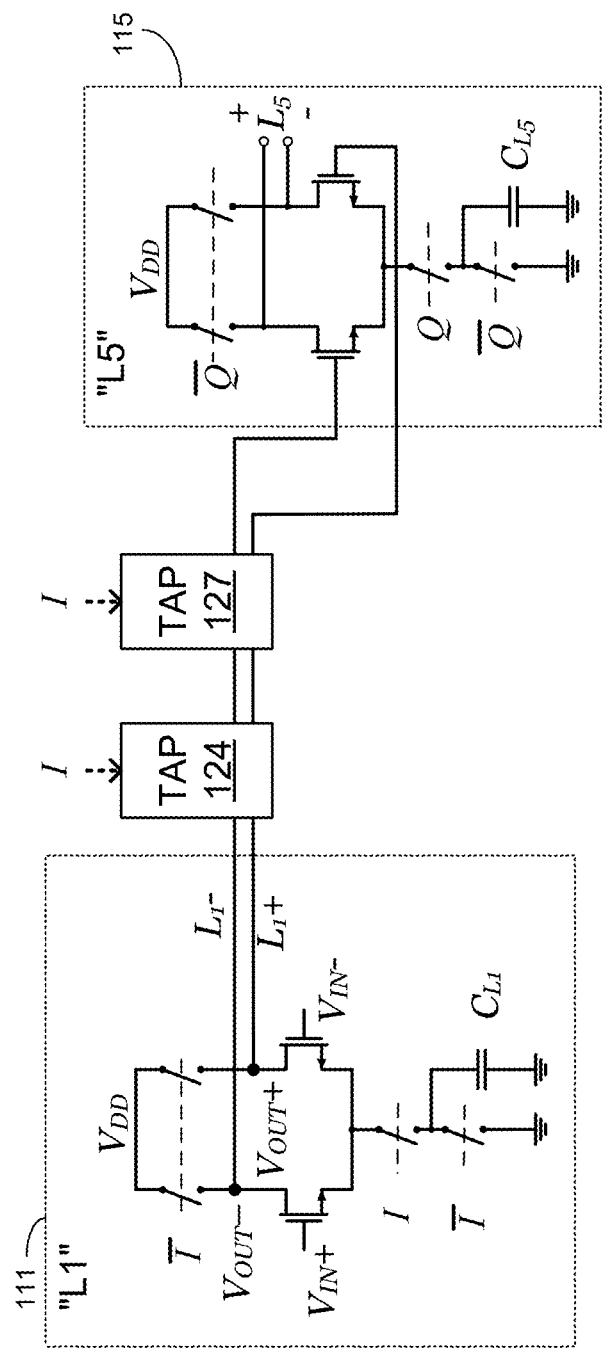
FIG. 11 is a partial circuit diagram of a quarter path of the example two-tap ¼-rate CS DFE illustrated in FIG. 7.

FIG. 11 is a partial circuit diagram of a quarter path of the DFE 200. FIG. 11 illustrates example circuitry of the primary latch L1 and the secondary latch L5. A similar partial circuit diagram could be drawn for the quarter path of the DFE 200 that includes the primary latch L2, the secondary latch L6, the primary tap 121, and the secondary tap 128. A similar partial circuit diagram could be drawn for the quarter path of the DFE 200 that includes the primary latch L3, the secondary latch L7, the primary tap 122, and the secondary tap 125. A similar partial circuit diagram could be drawn for the quarter path of the DFE 200 that includes the primary latch L4, the secondary latch L8, the primary tap 123, and the secondary tap 126.

The primary latch L1 comprises a differential pair of n-channel output transistors, a pair of switches driven by $\bar{I}$, an evaluation switch driven by I, a reset switch driven by $\bar{I}$, and a capacitor having capacitance $C_{L1}$. The pair of switches are connected between drain nodes of the n-channel output transistors and a first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential representation of a bit value provided by the input data stream $D_{IN-\bar{Q}}$. The drain nodes of the n-channel output transistors are connected to a differential pair of output nodes (labeled "$L_1$+" and "$L_1$−") of the primary latch L1.

The secondary latch L5 comprises a differential pair of n-channel output transistors, a pair of switches driven by $\bar{Q}$, an evaluation switch driven by Q, a reset switch driven by $\bar{Q}$, and a capacitor having capacitance $C_{L5}$. The pair of switches are connected between drain nodes of the n-channel output transistors and the first power supply rail. The reset switch is connected between the evaluation switch and the second power supply rail. The capacitor is connected between the second power supply rail and a node between the reset switch and the evaluation switch. The evaluation switch is connected to the source nodes of the n-channel output transistors. The gate nodes of the n-channel output transistors are connected to the differential pair of output nodes of the primary latch L1 as adjusted by the primary tap 124 and by the secondary tap 127. The drain nodes of the n-channel output transistors are connected to a differential pair of output nodes (labeled "$L_5$+" and "$L_5$−") of the secondary latch L5.

Figure 12:
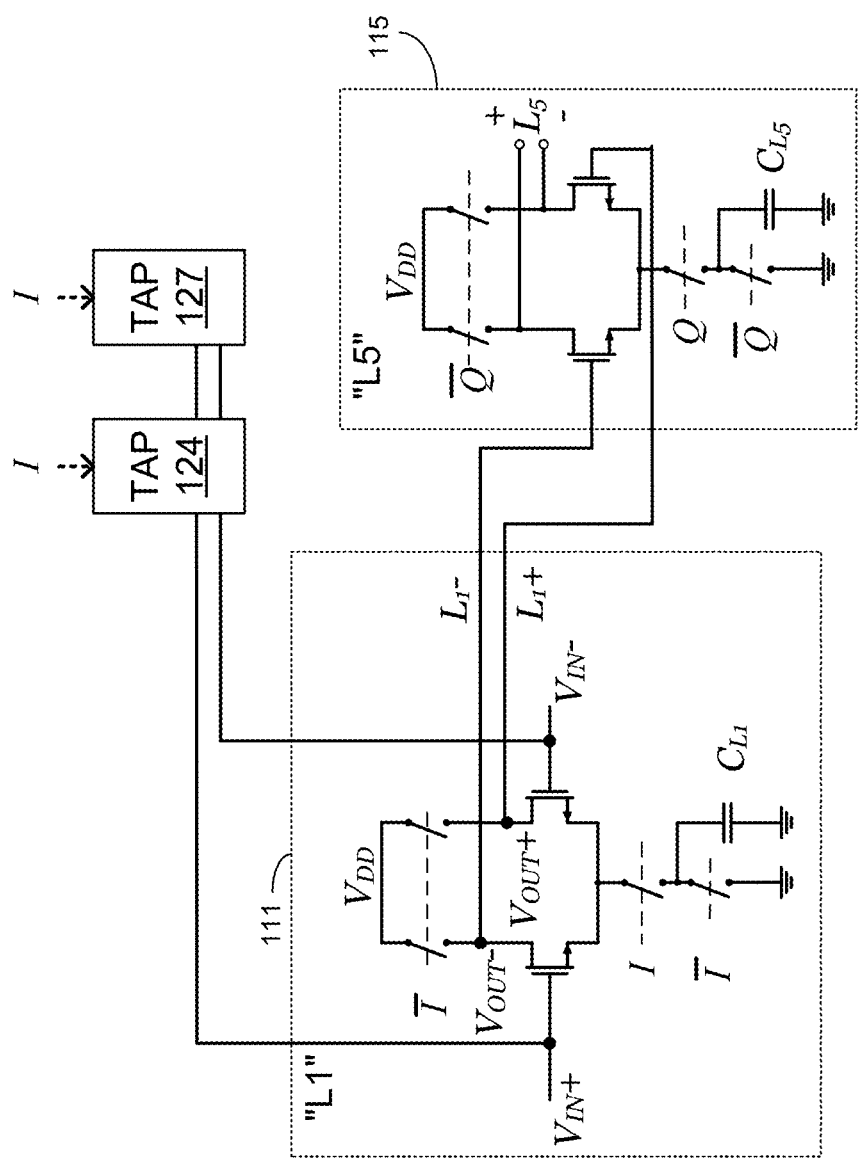
FIG. 12 is a partial circuit diagram of a quarter path of the example two-tap ¼-rate CS DFE illustrated in FIG. 8.

FIG. 12 is a partial circuit diagram of a quarter path of the DFE 250. FIG. 12 illustrates example circuitry of the primary latch L1 and the secondary latch L5. A similar partial circuit diagram could be drawn for the quarter path of the DFE 250 that includes the primary latch L2, the secondary latch L6, the primary tap 121, and the secondary tap 128. A similar partial circuit diagram could be drawn for the quarter path of the DFE 250 that includes the primary latch L3, the secondary latch L7, the primary tap 122, and the secondary tap 125. A similar partial circuit diagram could be drawn for the quarter path of the DFE 250 that includes the primary latch L4, the secondary latch L8, the primary tap 123, and the secondary tap 126.

The primary latch L1 comprises a differential pair of n-channel output transistors, a pair of switches driven by $\bar{I}$, an evaluation switch driven by I, a reset switch driven by $\bar{I}$, and a capacitor having capacitance $C_{L1}$. The pair of switches are connected between drain nodes of the n-channel output transistors and a first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential representation of a bit value provided by the input data stream $D_{IN\text{-}\bar{Q}}$ as adjusted by the primary tap 124 and by the secondary tap 127. The drain nodes of the n-channel output transistors are connected to a differential pair of output nodes (labeled "$L_1+$" and "$L_1-$") of the primary latch L1.

The secondary latch L5 comprises a differential pair of n-channel output transistors, a pair of switches driven by $\bar{Q}$, an evaluation switch driven by Q, a reset switch driven by $\bar{Q}$, and a capacitor having capacitance $C_{L5}$. The pair of switches are connected between drain nodes of the n-channel output transistors and the first power supply rail. The reset switch is connected between the evaluation switch and the second power supply rail. The capacitor is connected between the second power supply rail and a node between the reset switch and the evaluation switch. The evaluation switch is connected to the source nodes of the n-channel output transistors. The gate nodes of the n-channel output transistors are connected to the differential pair of output nodes of the primary latch L1. The drain nodes of the n-channel output transistors are connected to a differential pair of output nodes (labeled "$L_5+$" and "$L_5-$") of the secondary latch L5.

FIG. 13 is an example circuit diagram of a non-return-to-zero (NRZ) charge-steering (CS) latch 10. The latch 10 may be used to implement track-and-hold functionality. The latch 10 may be used to implement any of circuits 101, 102, 103, and 104. The latch 10 comprises a pair of differential input nodes 12, 14 and a pair of differential output nodes 22, 24. A switch 26 is connected between the input node 12 and the output node 22. A switch 28 is connected between the input node 14 and the output node 24. The latch 10 comprises n-channel FET transistors 30, 32. A gate of the transistor 30 is connected to a drain of the transistor 32 and to the output node 24. A gate of the transistor 32 is connected to a drain of the transistor 30 and to the output node 22. A source of the transistor 30 is connected to the source of the transistor 32 at an electrical node 34. A capacitor 36 is connected in parallel with a switch 38 between ground and an electrical node 40. A switch 42 is connected between the electrical node 34 and the electrical node 40. The switches 26, 28 and 38 are controllable by a clock signal to simultaneously open and close at a ¼-rate clock rate. The switch 42 is controllable by a clock signal that is complementary clock signal, so that the switch 42 is closed when the switches 26, 28 and 38 are open, and the switch 42 is open when the 26, 28 and 38 are closed.

FIGS. 14, 15, 16, 17, and 18 are circuit diagrams of example charge-steering (CS) taps, each of which may be used as any one of the taps 121 through 123 in DFE 100,150, or as any one of the taps 121 through 128 in DFE 200,250, or in a ¼-rate CS DFE having more than two taps. In all of these example CS taps, there is a differential pair of p-channel input transistors. The gate notes of the p-channel input transistors are connected to a differential pair of output nodes (labeled "L+" and "L−") of a ¼-rate CS latch being tapped that is one of the primary latches or one of the secondary latches, to receive a differential representation of the bit value held by that ¼-rate CS latch. The drain nodes of the p-channel input transistors are connected to the differential pair of nodes (labeled "V+" and "V−"). In cases where the tap is employed to affect the input to a primary latch (for example, in the DFE 150 and the DFE 250), the drain nodes of the p-channel input transistors are connected to the differential representation of a bit value provided by the input data stream $D_{IN}$. In cases where the tap is employed to affect the output of a primary latch (for example, in the DFE 100 and the DFE 200), the drain nodes of the p-channel input transistors are connected to the differential pair of output nodes of that primary latch.

Figure 14:
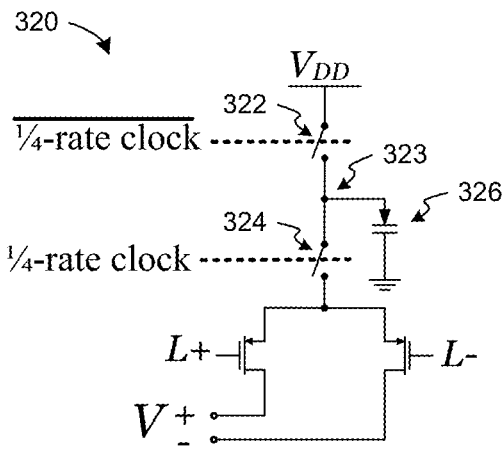
FIGS. 14, 15, 16, 17, and 18 are circuit diagrams of taps.

FIG. 14 is a circuit diagram of an example CS tap 320. The tap 320 is suitable for implementation using finFET technologies. The circuitry of the tap 320 comprises a differential pair of p-channel input transistors and a switching circuit that connects the source nodes of the p-channel input transistors to the first power supply rail (in this example, supplying the voltage $V_{DD}$). The switching circuit comprises a reset switch 322 connecting the first power supply rail to an intermediate node 323, an evaluation switch 324 connecting the intermediate node 323 to the source nodes of the p-channel input transistors, and a variable capacitor 326 connected between the intermediate node and the second power supply rail (in this example, ground). The evaluation switch 324 is driven by one of the ¼-rate clocks described in this document, and the reset switch 322 is driven by the complement of the ¼-rate clock that drives the evaluation switch 324.

In cases where the tap 320 is employed to affect the output of a primary latch (for example, in the DFE 100 and the DFE 200), the variable capacitor 326 helps pull one of the differential output nodes of the primary latch towards the first power supply rail instead of helping to pull the other one of the differential output nodes of the primary latch towards the second power supply rail. In cases where the tap 320 is employed to affect the input to a primary latch (for example, in the DFE 150 and the DFE 250), the variable capacitor 326 helps pull one of the differential input nodes of the primary latch towards the first power supply rail instead of helping to pull the other one of the differential input nodes of the primary latch towards the second power supply rail.

The capacitance of the variable capacitor 326 is related to the coefficient α that characterizes the tap 320. For example, where the tap 320 is implementing any one of the primary taps, the coefficient is $\alpha_1$. In another example, where the tap 320 is implementing any one of the secondary taps, the coefficient is $\alpha_2$.

Figure 15:
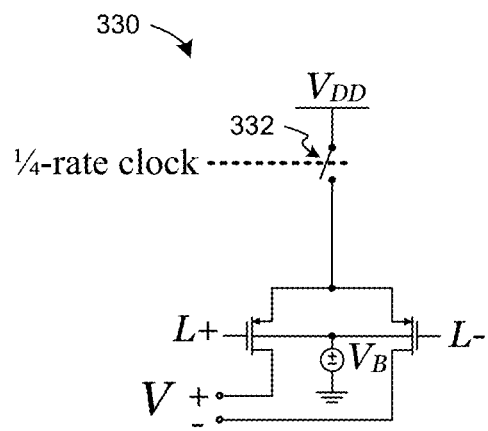

FIG. 15 is a circuit diagram of another example CS tap 330. The circuitry of the tap 330 comprises a differential pair of p-channel input transistors and a switching circuit that connects the source nodes of the p-channel input transistors are connected to the first power supply rail (in this example, supplying the voltage $V_{DD}$), where the gate nodes of the p-channel input transistors are connected to a bulk bias voltage VB. The switching circuit comprises a single reset switch 332 driven by one of the ¼-rate clocks described in this document.

In cases where the tap 330 is employed to affect the output of a primary latch (for example, in the DFE 100 and the DFE 200), the bulk bias voltage VB is used to change the threshold voltage of the differential pair of p-channel input transistors and in turn change the period of time for which the first power supply is adjusting the output of the primary latch. In cases where the tap 330 is employed to affect the input to a primary latch (for example, in the DFE 150 and the DFE 250), the bulk bias voltage $V_B$ is used to change the threshold voltage of the differential pair of p-channel input transistors and in turn change the period of time for which the first power supply is adjusting the input of the primary latch.

The setting of the bulk bias voltage $V_B$ is related to the coefficient α that characterizes the tap 330. The tap 330 is not suitable for implementation using finFET technologies, because the bulk bias cannot be adjusted in those technologies. Furthermore, the tap 330 cannot be completely shut off. Stated differently, even if the bulk bias voltage is forced to zero, the p-channel input transistors will still have a certain threshold voltage that causes them to turn on, and for channels with a good impulse response (that is, little energy spreading between bits), the tap 330 may still add intersymbol interference. However, the tap 330 is suitable for implementation in bulk CMOS and FD-SOI CMOS.

Figure 16:
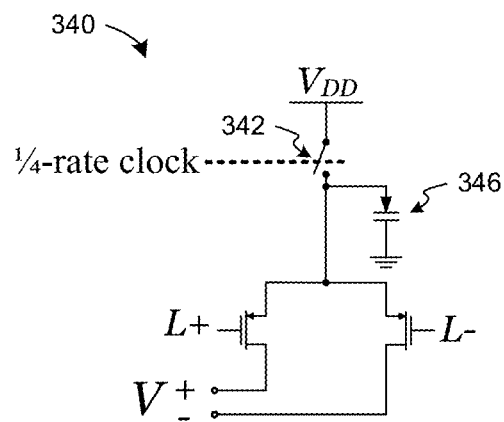

FIG. 16 is a circuit diagram of another example CS tap 340. The circuitry of the tap 340 comprises a differential pair of p-channel input transistors and a switching circuit that connects the source nodes of the p-channel input transistors to the first power supply rail (in this example, supplying the voltage $V_{DD}$). The switching circuit comprises a single reset switch 342 that connects the source nodes of the p-channel input transistors to the first power supply rail, and a variable capacitor 346 connected between the source nodes of the p-channel input transistors and the second power supply rail (in this example, ground). The single reset switch 342 is driven by one of the ¼-rate clocks described in this document.

In cases where the tap 340 is employed to affect the output of a primary latch (for example, in the DFE 100 and the DFE 200), the variable capacitor 346 helps pull one of the differential output nodes of the primary latch towards the first power supply rail instead of helping to pull the other one of the differential output nodes of the primary latch towards the second power supply rail. In cases where the tap 340 is employed to affect the input to a primary latch (for example, in the DFE 150 and the DFE 250), the variable capacitor 346 helps pull one of the differential input nodes of the primary latch towards the first power supply rail instead of helping to pull the other one of the differential input nodes of the primary latch towards the second power supply rail. The capacitance of the variable capacitor 346 is related to the coefficient α that characterizes the tap 340. For example, where the tap 340 is implementing any one of the primary taps, the coefficient is $α_1$. In another example, where the tap 340 is implementing any one of the secondary taps, the coefficient is $α_2$. The tap 340 is suitable for implementation using finFET technologies, however, the tap 340 cannot be completely shut off.

It was shown in U.S. Patent Publication 2018/0302070 that a small varactor at the drain of a differential pair of transistors can be used to change the transconductance, denoted $g_m$, of the transistors, resulting in the same effect as the bulk bias of the tap 330.

Figure 17:
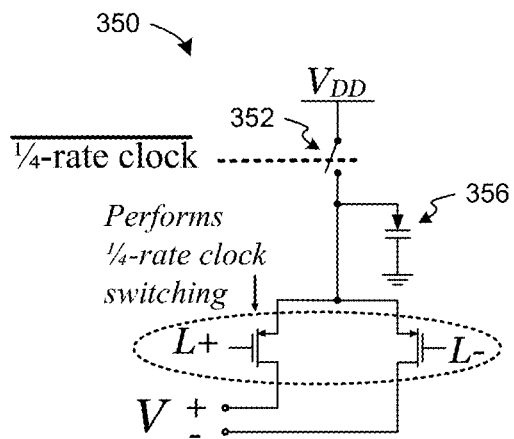

FIG. 17 is a circuit diagram another example CS tap 350. The tap 350 is suitable for implementation using finFET technologies. The circuitry of the tap 350 comprises a differential pair of p-channel input transistors and a switching circuit that connects the source nodes of the p-channel input transistors to the first power supply rail (in this example, supplying the voltage $V_{DD}$). The switching circuit comprises a single reset switch 352 that connects the source nodes of the p-channel input transistors to the first power supply rail, and a variable capacitor 356 connected between the source nodes of the p-channel input transistors and the second power supply rail (in this example, ground). The single reset switch 352 is driven by one of the ¼-rate clocks described in this document.

In cases where the tap 350 is employed to affect the output of a primary latch (for example, in the DFE 100 and the DFE 200), the variable capacitor 356 helps pull one of the differential output nodes of the primary latch towards the first power supply rail instead of helping to pull the other one of the differential output nodes of the primary latch towards the second power supply rail. In cases where the tap 350 is employed to affect the input to a primary latch (for example, in the DFE 150 and the DFE 250), the variable capacitor 356 helps pull one of the differential input nodes of the primary latch towards the first power supply rail instead of helping to pull the other one of the differential input nodes of the primary latch towards the second power supply rail. The capacitance of the variable capacitor 356 is related to the coefficient α that characterizes the tap 350. For example, where the tap 350 is implementing any one of the primary taps, the coefficient is $α_1$. In another example, where the tap 350 is implementing any one of the secondary taps, the coefficient is $α_2$.

CS latches have a return-to-zero output as both output nodes reach $V_{DD}$ during the reset period. In view of this and the use of p-channel input transistors in the differential pair, the differential pair in the tap 350 acts as a ¼-rate switch 180° out of phase with the single reset switch. When the ¼-rate CS latch connected to the gate nodes of the p-channel input transistors is in its evaluation mode, the capacitor of the tap 350 has a discharge path to the differential pair of output nodes (labeled "$V_{OUT}+$" and "$V_{OUT}-$" in FIG. 11) of the primary latch (for example, the primary latch L1 in FIG. 11). Conversely, when the ¼-rate CS latch connected to the gate nodes of the p-channel input transistors is in its reset mode, the differential pair of p-channel input transistors "opens" and the reset switch closes, charging the capacitor back to $V_{DD}$.

In the taps 320, 330, 340, and 350, at least one switch is driven by one of the ¼-rate clocks described in this document. The determination whether the switch is driven by the in-phase clock I or its complementary clock $\bar{I}$ or the quadrature clock Q or its complementary clock $\bar{Q}$ depends on which tap of the ¼-rate CS DFE is being implemented. For example, if the primary tap 121 is being implemented as the tap 340, then the switch 342 is driven by the ¼-rate in-phase clock Q. In another example, if the secondary tap 125 is being implemented as the tap 330, then the switch 332 is driven by the ¼-rate quadrature clock $\bar{I}$.

Figure 18:
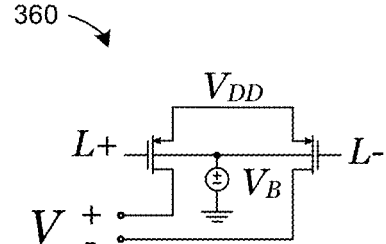

FIG. 18 is a circuit diagram of another example CS tap 360, which may be used as any one of the taps 121 through 128, or in a ¼-rate CS DFE having more than two taps.

The circuitry of the tap 360 comprises a differential pair of p-channel input transistors. The source nodes of the p-channel input transistors are directly connected to the first power supply rail (in this example, supplying the voltage $V_{DD}$). The gate nodes of the p-channel input transistors are connected to a bulk bias voltage $V_B$.

In cases where the tap 360 is employed to affect the output of a primary latch (for example, in the DFE 100 and the DFE 200), the bulk bias voltage $V_B$ is used to change the threshold voltage of the differential pair of p-channel input transistors and in turn change the period of time for which the first power supply is adjusting the output of the primary latch. In cases where the tap 360 is employed to affect the input to a primary latch (for example, in the DFE 150 and the DFE 250), the bulk bias voltage $V_B$ is used to change the threshold voltage of the differential pair of p-channel input transistors and in turn change the period of time for which the first power supply is adjusting the input of the primary latch.

The setting of the bulk bias voltage $V_B$ is related to the coefficient α that characterizes the tap 360. The tap 360 is not suitable for implementation using finFET technologies, because the bulk bias cannot be adjusted in those technologies. Furthermore, the tap 360 cannot be completely shut off. However, the tap 360 is suitable for implementation in bulk CMOS and FD-SOI CMOS.

An element driven by a ½-rate clock is denoted a "½-rate element". Because the taps 320, 330, 340, 350, and 360 do not comprise any ½-rate elements, there is no need to route a ½-rate clock to those taps. Furthermore, the absence of any ½-rate elements in the taps 320, 330, 340, 350, and 360 means that clock buffer power for any switches that are driven by a ¼-rate clock has been halved. When a reset switch is driven by a ¼-rate clock (as is the case for the taps 320, 330, 340, and 350), this extends how long the tap capacitor will charge for, but it is desirable in this example for this capacitor to reach $V_{DD}$ regardless, so no extra power is consumed. In fact, a larger resistance can be tolerated and the capacitor will still reach $V_{DD}$, given the doubled reset period. This permits making the reset switch smaller, saving more clock buffer power. Anytime a ¼-rate switch is used in place of a ½-rate switch, the period during which the switch is on has doubled and so the resistance that makes up the switch's time constant can double. To further clarify, the time it takes to charge a capacitor to 99% is given by 5RC, where R is the resistance between the power supply and the capacitor having capacitance C. Therefore, if the time is doubled and the capacitance has remained the same, the resistance can be doubled which allows the transistor to be halved in size. This in turns halves the transistors gate capacitance which saves clock buffer power.

Figure 19:
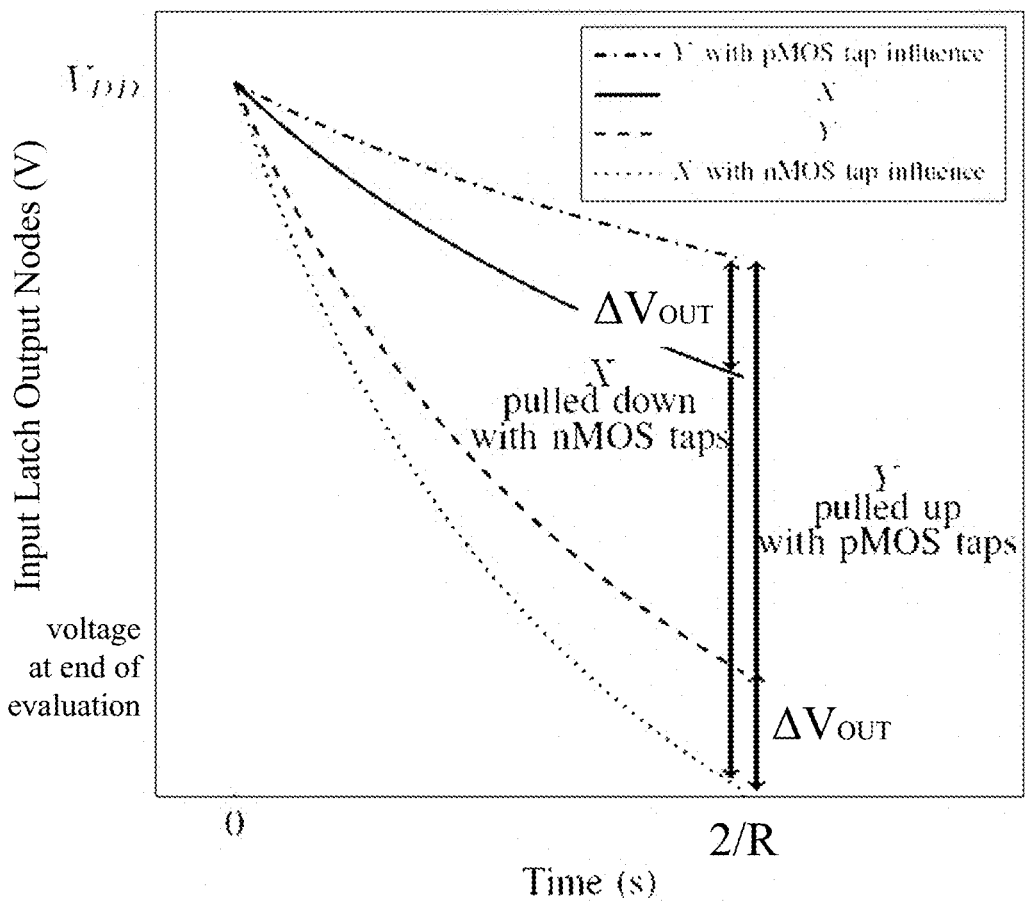
FIG. 19 illustrates a concept relating to the use of a tap having a differential pair of p-channel input transistors.

FIG. 19 illustrates a concept relating to the use of a tap having a differential pair of p-channel input transistors. X represents one of the output nodes (for example, $V_{OUT}+$) of the primary latch and Y represents the other output node (for example $V_{OUT}-$) of the primary latch. $\Delta V_{OUT}$ is the differential swing between output nodes of the primary latch (this can be expressed mathematically as $\Delta V_{OUT}= |(V_{OUT}+)-(V_{OUT}-)|$). Presume a wrong decision has been made at the output of the primary latch, and the X node must go below Y Traditionally, the X node would be pulled down (that is, towards the second power supply rail, which in this example is ground) to make the correct decision, but with the new taps, Y has been pulled up (that is, towards the first power supply rail, which in this example is $V_{DD}$). The final differential swing $\Delta V_{OUT}$ is the same regardless of which tap is used, but the amount that the capacitors in the primary latch must be charged has been reduced with the use of p-channel input transistors in the tap.

Figure 20:
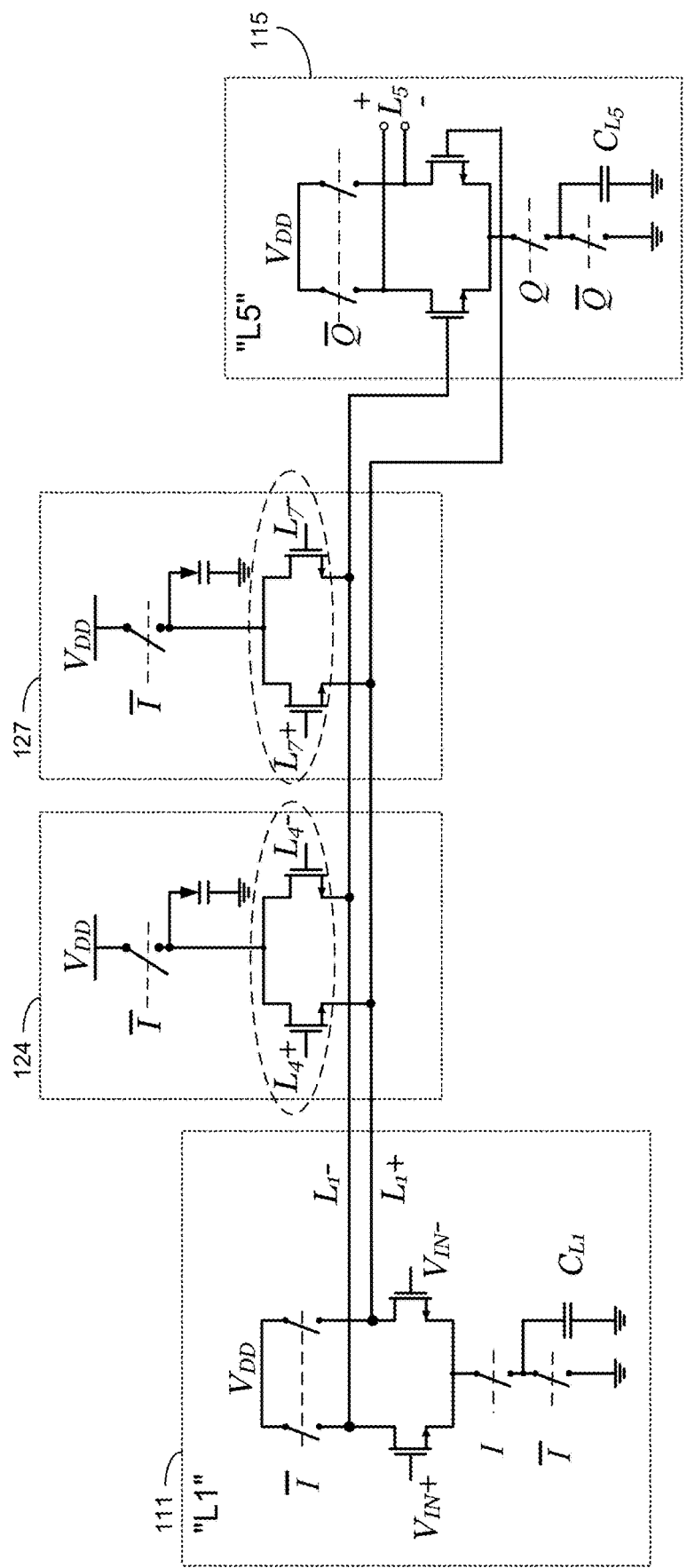
FIG. 20 illustrates a circuit diagram of a quarter-path of the example two-tap ¼-rate CS DFE of FIG. 7 using the tap illustrated in FIG. 17.

FIG. 20 illustrates a circuit diagram of a quarter-path of the DFE 200, the DFE 200 using the tap 350 for the taps 124 and 127.

Figure 21:
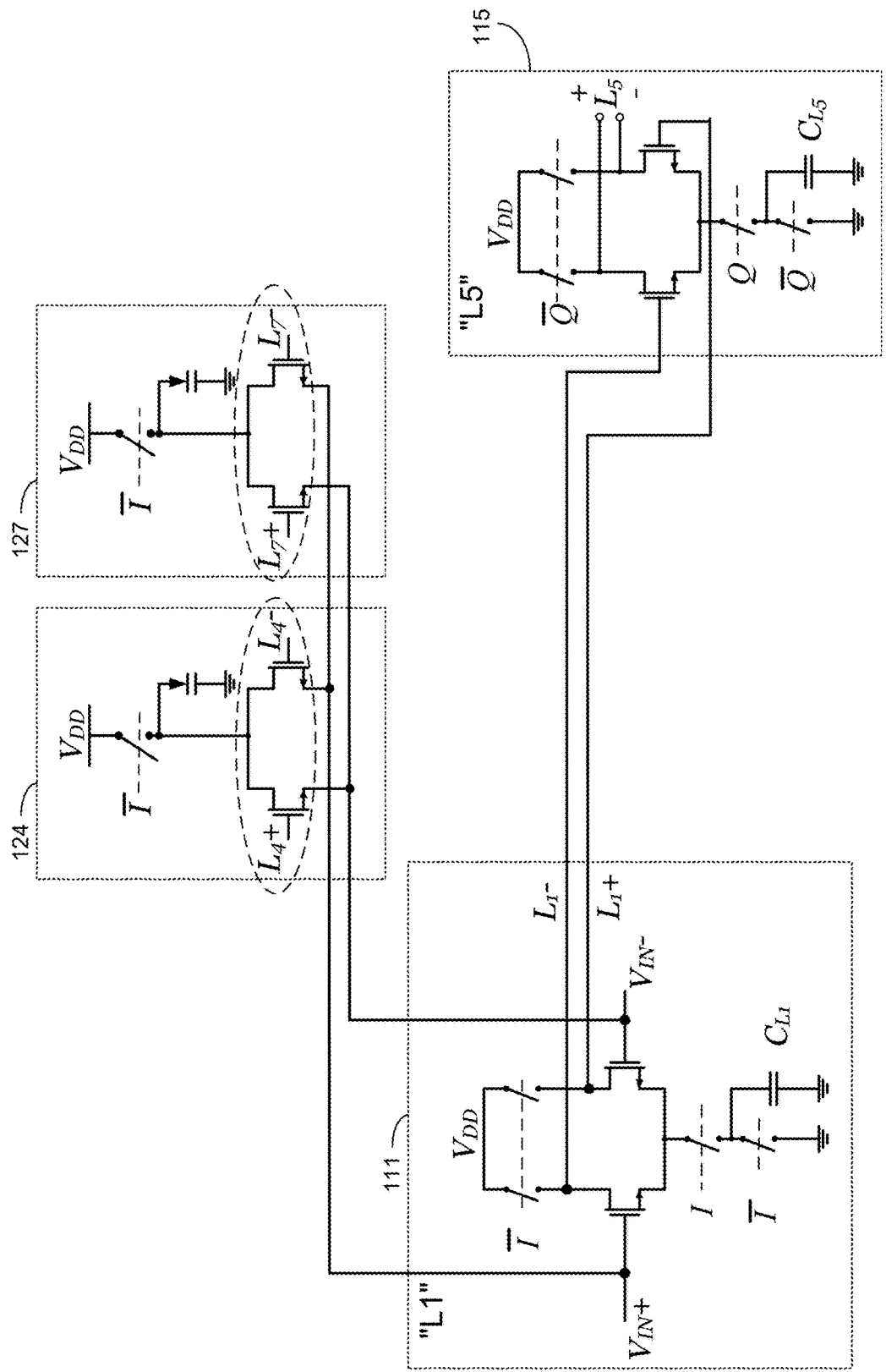
FIG. 21 illustrates a circuit diagram of a quarter-path of the example two-tap ¼-rate CS DFE of FIG. 8 using the tap illustrated in FIG. 17.

FIG. 21 illustrates a circuit diagram of a quarter-path of the DFE 250, the DFE 250 using the tap 350 for the taps 124 and 127.

Figure 22:
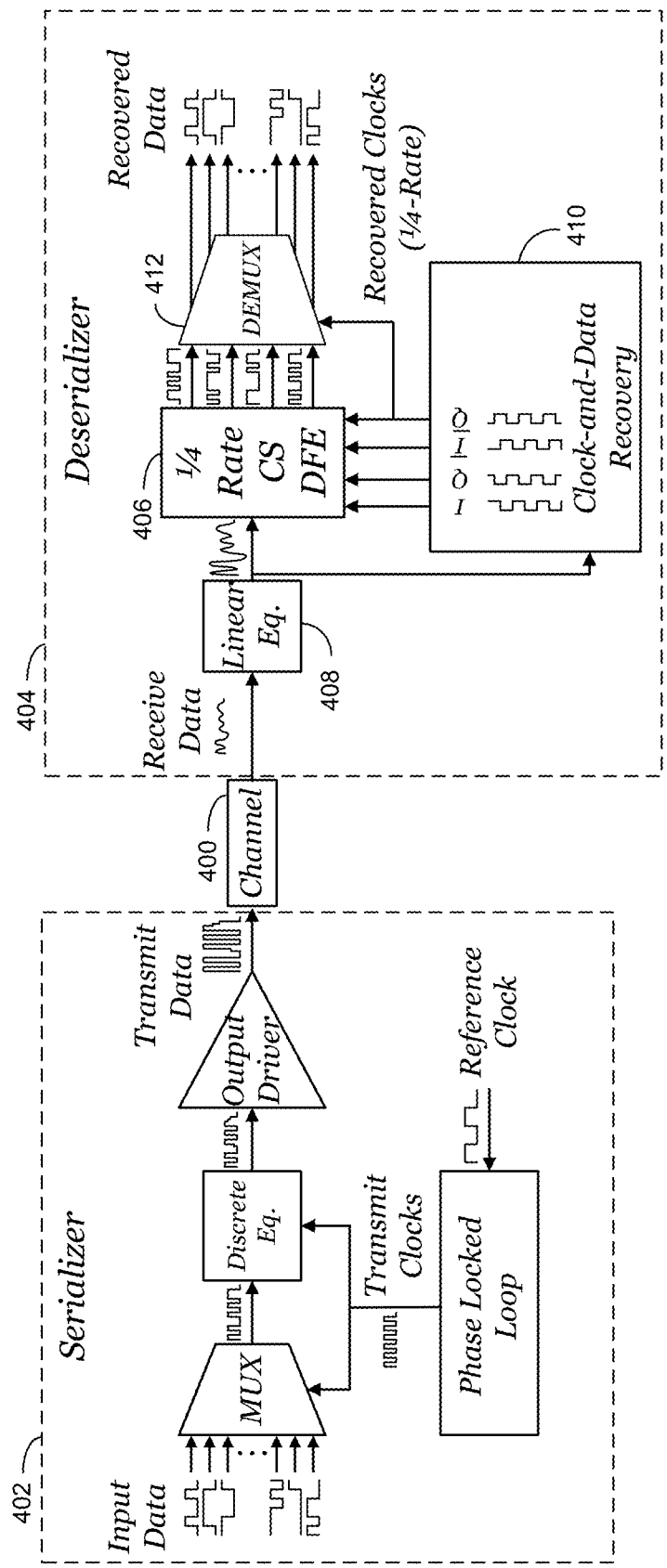
FIG. 22 is block diagram showing transfer of data over a channel from an example serializer device to an example deserializer device, where the deserializer device comprises a ¼-rate CS DFE that incorporates any one of the taps illustrated in FIGS. 14, 15, 16, 17, and 18.

FIG. 22 is block diagram showing transfer of data over a channel 400 from an example serializer device 402 to an example deserializer device 404, where the deserializer device 404 comprises a ¼-rate CS DFE 406 that incorporates any one or more of the new taps illustrated in FIGS. 14, 15, 16, 17, and 18. The DFE 100, 150, 200, and 250 are four examples of ¼-rate CS DFEs that could be used for the ¼-rate CS DFE 406. The DFE 406 further comprises a linear equalizer module 408 to amplify the signal received over the channel 400, a clock-and-data recovery module 410, and a demultiplexer module 412 to deserialize the output of the DFE 406. The DFE 406 and the clock-and-data recovery module 410 act on the amplified signal output from the linear equalizer module 408. The clock-and-data recovery module 410 provides the various ¼-rate clocks to the DFE 406 and to the demultiplexer module 412.

Figure 23:
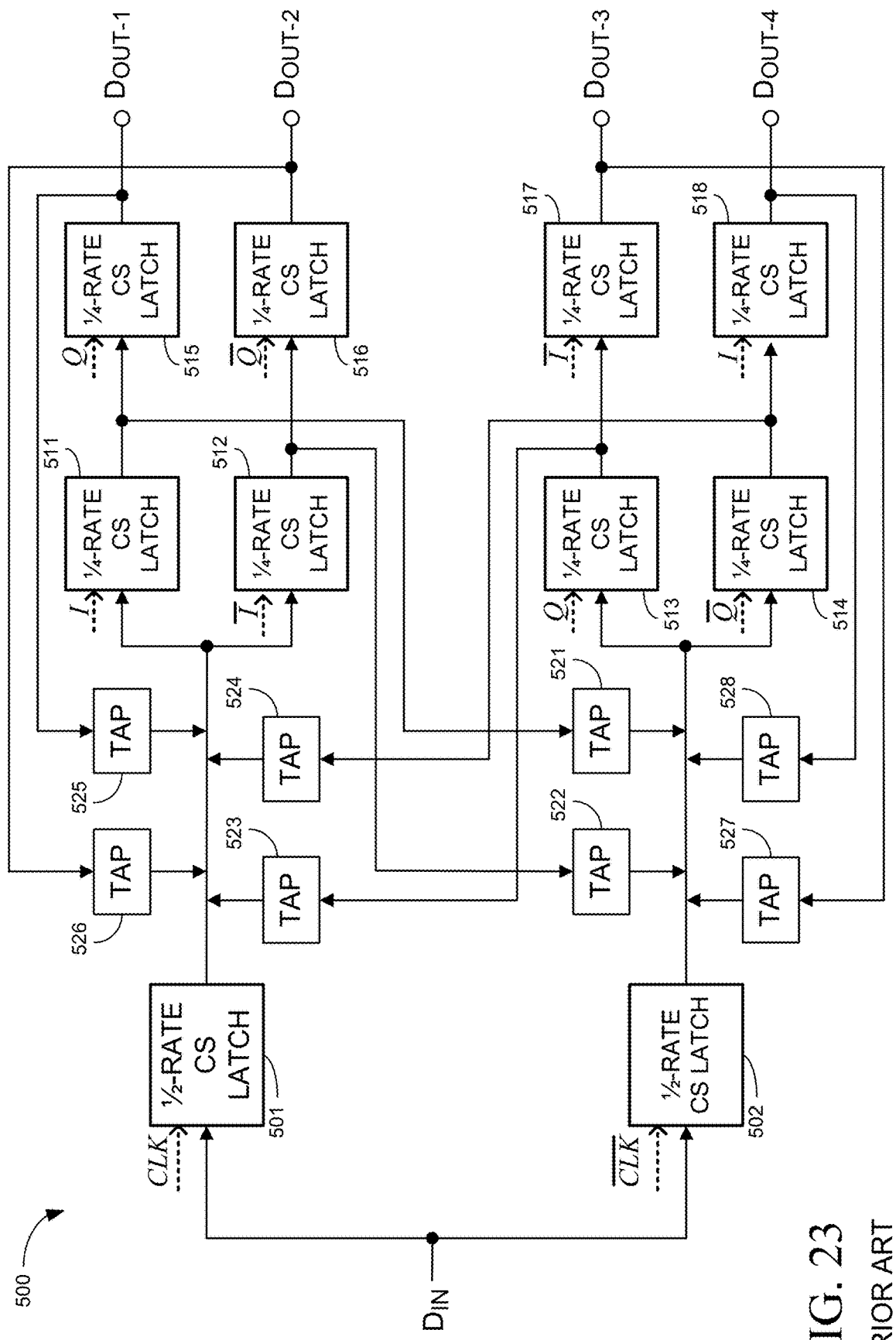
FIG. 23 is a schematic diagram of an example two-tap ½-rate CS DFE.

FIG. 23 is a schematic diagram of an example two-tap ½-rate CS DFE 500, based on the CS equalizers described in A. Manian and B. Razavi, "A 40-Gb/s 14-mW CMOS Wireline Receiver", *IEEE Journal of Solid-State Circuits*, vol. 52, no. 9, September 2017.

An analog input data stream $D_{IN}$ conveys data at a data rate R, for example, at 56 Gb/s or at 112 Gb/s or higher. Components of the DFE 500 are driven by clocks. Input data has a data rate given in bits per second, but its highest possible frequency component, given is Hertz, is half the data rate. A ½-rate clock is the same speed as the data rate if there is a transition every bit. A ¼-rate clock is twice as slow as the data rate. Stated differently, if a data rate represents different data at a max frequency f, then a ½-rate clock changes its state at the frequency f and a ¼-rate clock changes its state at the frequency ½f.

The following clocks are employed: complementary ½-rate clocks labeled CLK and $\overline{CLK}$, an in-phase ¼-rate clock labeled I that is in-phase with CLK (that is, a rising edge of I coincides with a rising edge of CLK), a quadrature ¼-rate clock labeled Q that is 90° out of phase with I (that is, a rising edge of Q coincides with a rising edge of $\overline{CLK}$), a ¼-rate clock labeled $\bar{I}$ that is complementary to I, and a ¼-rate clock labeled $\bar{Q}$ that is complementary to Q. When one of the ½-rate clocks is high, the other ½-rate clock is low, and vice versa. Stated differently, the clock $\bar{I}$ is 180° out of phase with I, and the clock $\bar{Q}$ is 180° out of phase with Q.

The DFE 500 comprises ten CS latches: two ½-rate CS latches 501 and 502, and eight ¼-rate CS latches 511 through 518.

Figure 24:
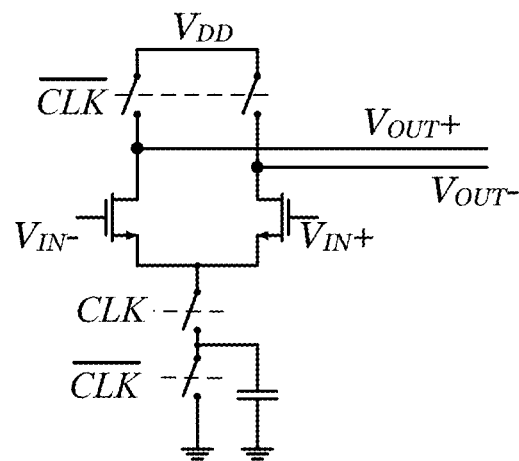
FIG. 24 is an example circuit diagram of a ½-rate CS latch used in the example two-tap ½-rate CS DFE of FIG. 23.

Latches 501 and 502 are referred to as ½-rate CS latches, because they are driven by ½-rate clocks. Latch 501 (referred to as "input latch 501") is driven by CLK and samples the input data stream $D_{IN}$ when CLK is high. Latch 502 (referred to as "input latch 502") is driven by $\overline{CLK}$ and samples the input data stream $D_{IN}$ when $\overline{CLK}$ is high. FIG. 24 is an example circuit diagram of either the ½-rate CS latch 501 or the ½-rate CS latch 502.

The latch 515 is driven by Q and samples the value held in the latch 511 when Q is high. The latch 516 is driven by $\bar{Q}$ and samples the value held in the latch 512 when $\bar{Q}$ is high. The latch 517 is driven by $\bar{I}$ and samples the value held in the latch 513 when Ī is high. The latch 518 is driven by I, and samples the value held in the latch 514 when I is high.

The line connecting the output of the input latch 502 to the input of the latch 513 and to the input of the latch 514 is affected by taps 521, 522, 527, and 528. The line connecting the output of the input latch 501 to the input of the latch 511 and to the input of the latch 512 is affected by taps 523, 524, 525, and 526.

Figure 25:
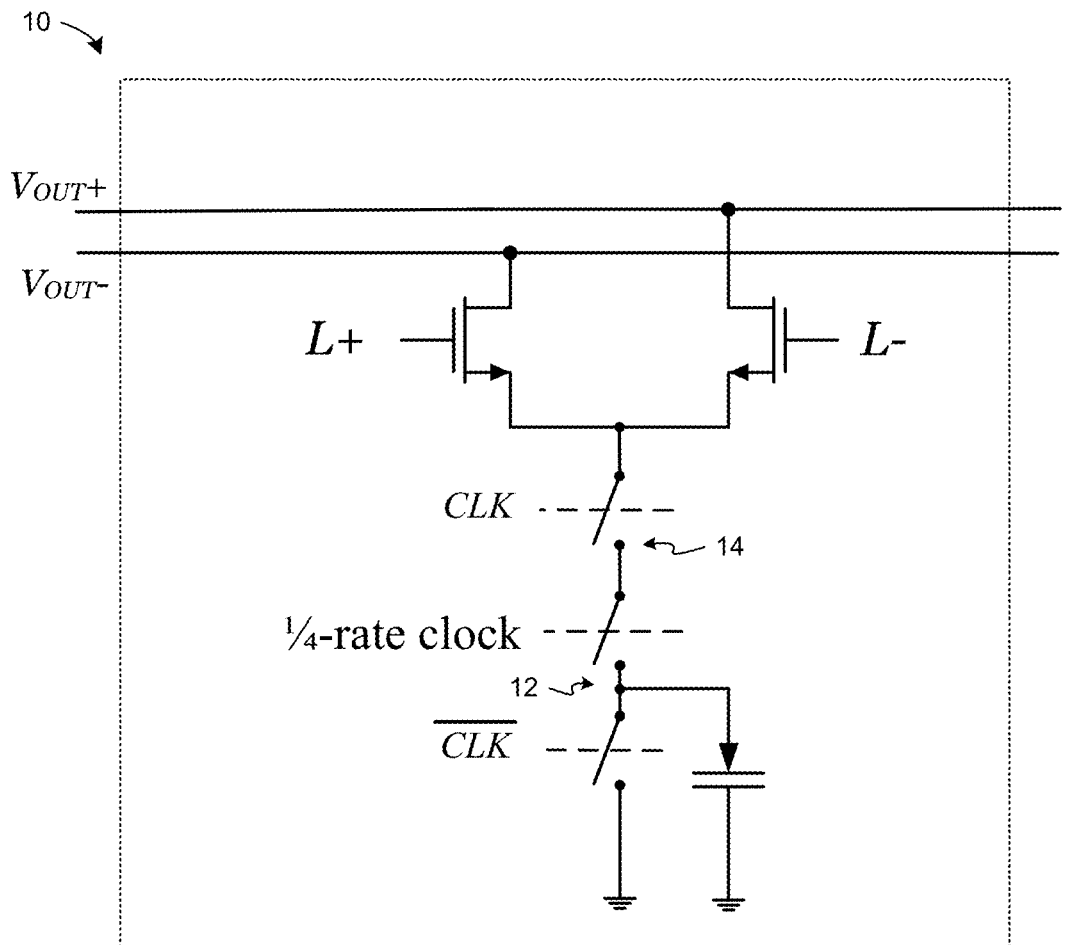
FIG. 25 is an example circuit diagram of a prior art tap used in the example two-tap ½-rate CS DFE of FIG. 23.

FIG. 25 is an example circuit diagram of a prior art tap 10, described in A. Manian and B. Razavi, "A 40-Gb/s 14-mW CMOS Wireline Receiver", *IEEE Journal of Solid-State Circuits*, vol. 52, no. 9, September 2017. FIG. 22 illustrates the circuitry of the taps 521, 522, 523, 524, 525, 526, 527, and 528 used in the DFE 500.

The circuitry of prior art tap 10 comprises a differential pair of n-channel output transistors and a switching circuit that connects the drain nodes of the n-channel output transistors to the second power supply rail (in this example, ground). The gate nodes of the n-channel output transistors are connected to a differential pair of output nodes (labeled "L+" and "L−") of a latch to receive a differential representation of the bit value held by that latch. The source nodes of the n-channel output transistors are connected to the differential pair of output nodes (labeled "$V_{OUT}+$" and "$V_{OUT}-$") of an input latch (either the input latch 501 or the input latch 502).

The switching circuit comprises a variable capacitor and a stacked series of switches: a "bottom" switch connecting the second power supply rail to a first intermediate node 12, a "middle" switch driven by a ¼-rate clock connecting the "bottom" switch to a second intermediate node 14, and a "top" switch connecting the second intermediate node 14 to the source nodes of the n-channel output transistors. The variable capacitor connects the second power supply rail to the first intermediate node 12. As illustrated in FIG. 22, the "top" switch is driven by CLK and the "bottom" switch is driven by its complementary clock, namely $\overline{CLK}$. In an alternate implementation, the "bottom" switch is driven by CLK and the "top" switch is driven by its complementary clock, namely $\overline{CLK}$.

Two elements of the prior art tap 10 are driven by ½-rate clocks. As data rates increase, the routing of ½-rate clocks is difficult. Stacked series switches, such as used in the prior art tap 10, are difficult to implement in Fin Field-Effect-Transistor (FinFET) technologies. The use of numerous switches in the prior art tap 10 requires significant power in the clock buffers.

Simulations of transfer of data over a channel from a serializer device to a deserializer device were performed, with the deserializer device including a Continuous Time Linear Equalizer (CTLE), a Low Frequency Equalizer (LFE), and a two-tap CS DFE. CTLEs provide an amplitude boost to incoming data. LFEs provide linear gain, though at lower frequencies, while the CTLE is designed to peak around the Nyquist frequency. The simulation results are presented with data randomly generated at 56 Gb/s and passed through a touchstone channel model from the IEEE 802.3 400 GbE task force. A channel loss of 14.47 dB can be seen at 28 GHz. Clocks used in the DFE are square with 10% rise and fall times and an amplitude of 1 Volt (V). $V_{DD}$ was also set to 1 V The common-mode voltage is 800 mV The program used for simulations was the Cadence® Virtuoso® custom design platform using the Cadence® Spectre® Circuit Simulator as the simulator, and the transistor model was a Leti-UTSOI2 model.

Three separate simulations were performed. All sizing for the CTLE and LFE were kept constant for each simulation. The capacitors in the latches were kept constant. Each simulation simulated the entire serializer device and the entire deserializer device.

In each simulation it was ensured that perfect data recovery was performed at 56 Gb/s NRZ, that is, a bit error rate (BER) of $10^{-12}$ for 100 ns simulations.

In the simulation with DFE Type labeled "Conventional ½-rate CS DFE", the two-tap DFE in the simulated deserializer is the two-tap ½-rate CS DFE 500 described above with respect to FIG. 23, FIG. 24 and FIG. 25.

In the simulation with DFE Type labeled "¼-rate CS DFE (FIG. 5)", the two-tap DFE in the simulated deserializer is the two-tap ¼-rate CS DFE 200 described above with respect to FIG. 7, where the taps 121, 122, 123, 124, 125, 126, 127, and 128 are all "implemented" as the tap 350 described above with respect to FIG. 17. A quarter-path of that DFE is described above with respect to FIG. 20.

In the simulation with the DFE Type labeled "¼-rate CS DFE (FIG. 6)", the two-tap DFE in the simulated deserializer is the two-tap ¼-rate CS DFE 250 described above with respect to FIG. 8, where the taps 121, 122, 123, 124, 125, 126, 127, and 128 are all "implemented" as the tap 350 described above with respect to FIG. 17. A quarter-path of that DFE is described above with respect to FIG. 21.

The results are summarized in Table 3:

TABLE 3

| DFE Type | Simulation Time | Data Rate | Bit Errors | DFE Power Consumption | DFE Total Switch Capacitance | Clocks in the Design |
| --- | --- | --- | --- | --- | --- | --- |
| Conventional ½-rate CS DFE | 100 ns | 56 Gb/s NRZ | 0 | 5.291 mW | 192 ff (Corresponds to ~3.68 mW in the clock drivers) | 28 GHz; 14 GHz IQ |
| ¼-rate CS DFE (FIG. 5) | 100 ns | 56 Gb/s NRZ | 0 | 3.648 mW | 108 ff (Corresponds to ~1.51 mW in the clock drivers) | 14 GHz IQ |
| ¼-rate CS DFE (FIG. 6) | 100 ns | 56 Gb/s NRZ | 0 | 3.091 mW | 108 ff (Corresponds to ~1.51 mW in the clock drivers) | 14 GHz IQ |
| ¼-rate CML DFE (estimates) | N/A | 56 Gb/s NRZ | N/A | 16.05 mW | 24 ff (Corresponds to 25% 14 GHz ~336 µW in the clockIQ; 50% drivers) | 14 GHz IQ |

To perform perfect recovery, the simulated conventional two-tap ½-rate CS DFE consumed 5.291 mW, while the simulated two-tap ¼-rate CS DFE 200 consumed 3.648 mW and the simulated two-tap ¼-rate CS DFE 250 consumed 3.091 mW. This corresponds to a power savings of 31% and 41% respectively. About 11% of these power savings result from the use of pMOS taps, 20% of these power savings result from eliminating two latches (compared to the simulated conventional two-tap ½-rate CS DFE 500), and the remaining 10% results from having the taps affect the inputs of the primary latches instead of affecting the outputs of the primary latches.

The conventional two-tap ½-rate CS DFE 500 has 24 ½-rate switches and 40 ¼-rate switches. The capacitance of each switch adds power consumption to the clock drivers. This power can be approximated by $P=CV^2f$ where C is the capacitance seen at the gate of the switch being driven, V is the amplitude of the clock that is driving the switch, and f is the frequency of the clock. All ½-rate switches have been eliminated from the topologies of the two-tap ¼-rate CS DFEs described in this document. The two-tap ¼-rate CS DFE 200 has the same number of ¼-rate switches as the conventional two-tap ½-rate CS DFE 500. The two-tap ¼-rate CS DFE 250 has the same number of ¼-rate switches as the conventional two-tap ½-rate CS DFE 500.

The total gate capacitance contributed by the DFE to the clock drivers has been reduced from 192 fF in the conventional two-tap ½-rate CS DFE 500 to 108 fF in the two-tap ¼-rate CS DFEs 200,250. These capacitances correspond to 3.68 mW and 1.51 mW being added to the clock driver power consumption, respectively, which corresponds to power savings of approximately 60% in the two-tap ¼-rate CS DFEs 200,250.

Since there are no elements in the two-tap ¼-rate CS DFEs 200,250 being driven by ½-rate clocks, there is no need for ½-rate clock generation, and therefore power has been approximately halved.

These simulations demonstrate the ability of the ¼-rate CS DFEs to be seamlessly used at 112 Gb/s PAM-4. The DFEs of a PAM-4 transceiver are often the same DFE used in an NRZ charge-steering latch. A general PAM-4 architecture would see slicers used at the input to split the PAM-4 data into three NRZ data streams. For example, if the four PAM-4 levels are 0, 0.33, 0.66, and 1, then the slicers would split the data into three streams. The first stream would be NRZ data for transitions between 0 and 0.33, the second stream would be NRZ data for transitions between 0.33 and 0.66, and the third stream would be NRZ data for transitions between 0.66 and 1. At this point, the DFE that is used is identical to those used in NRZ transceivers. For example, J. Lee et al., "Design of 56 Gb/s NRZ and PAM4 SerDes Transceivers in CMOS Technologies", *IEEE Journal of Solid-State Circuits*, vol. 50, no. 9, September 2015 describes such a transceiver.

In addition to the power savings, layout has become much easier at 56 Gb/s and 112 Gb/s. The reduction in the number of overall switches means that there are fewer clocks to route. Furthermore, the routing of clocks is done at a lower frequency (quarter-rate instead of half-rate), which is simpler. Where before, clock distribution made charge-steering an inappropriate choice for a serializer-deserializer (SerDes) operating at these speeds, charge-steering is now a viable alternative to current mode logic (CML).

The scope of the claims is intended to encompass the following modifications to what has been described thus far, as well as any other modifications considered obvious to a person of ordinary skill in the art.

The DFEs 100,150 are example one-tap ¼-rate CS DFEs. Each quarter-path of the DFE 100,150 comprises a single latch and a single tap. The DFEs 200,250 are example two-tap ¼-rate CS DFEs. Each quarter-path of the DFE 200,250 comprises two latches and two taps. It is obvious to a person of ordinary skill in the art to extend the teachings of this document to a three-tap ¼-rate DFE (where each quarter-path comprises three latches and three taps), to a four-tap ¼-rate DFE (where each quarter path comprises four latches and four taps), and to a ¼-rate DFE having more than four taps per quarter-path.

This document refers to a first power supply rail and to a second power supply rail. In the examples described in this document, the first power supply rail supplies a voltage $V_{DD}$ and the second power supply rail is ground. In alternate implementations, the first power supply rail could be ground and the second power supply rail could supply the voltage $V_{DD}$.

In the examples described in this document, the latches use n-channel output transistors and the taps use p-channel input transistors. In alternate implementations, the latches could use p-channel input transistors and the taps could use n-channel output transistors. With these alternate implementations, references in this document to "drain node" should be changed to "source node", and references in this document to "source node" should be changed to "drain node".

A variable capacitor, also known as a tunable capacitor and as an adjustable capacitor, is a capacitor whose capacitance can be changed. The variable capacitors in the taps 320, 340, and 350 have been illustrated as varactors. Any other suitable implementation of a variable capacitor is also contemplated. For example, the variable capacitors in the taps could be implemented as a bank of switched capacitors.

The scope of the claims should not be limited by the details set forth in the examples, but should be given the broadest interpretation consistent with the description as a whole.

What is claimed is:

1. A decision feedback equalizer (DFE) comprising:
   four charge-steering (CS) primary latches, each of the primary latches including a respective differential pair of n-channel output transistors; and
   four primary taps,
   wherein two of the four CS primary latches are driven by complementary in-phase ¼-rate clocks and the other two of the four CS primary latches are driven by complementary quadrature ¼-rate clocks,
   wherein each primary tap includes a respective differential pair of p-channel input transistors connected via their gate nodes to a respective one of the four CS primary latches, and
   wherein no element of the DFE is driven by any ½-rate clock.

2. The DFE as recited in claim 1, further comprising:
   four circuits to demultiplex an input data stream into four input data streams such that the first input data stream overlaps the second input data stream by 50%, the second input data stream overlaps the third input data stream by 50%, the third input data stream overlaps the fourth input data stream by 50%, and the fourth input data stream overlaps the first input data stream by 50%.

3. The DFE as recited in claim 2, wherein each of the four circuits is a simple switch driven by a respective one of the ¼-rate clocks.

4. The DFE as recited in claim 2, wherein each of the four circuits is a track-and-hold circuit.

5. The DFE as recited in claim 2, wherein for each primary tap the respective differential pair of p-channel input transistors are connected via their drain nodes to a differential representation of a bit value provided by a respective one of the four input data streams.

6. The DFE as recited in claim 1, wherein for each primary tap the respective differential pair of p-channel input transistors are connected via their drain nodes to a different respective one of the four CS primary latches.

7. The DFE as recited in claim 1, wherein every switch of at least one of the primary taps is driven by one of the ¼-rate clocks.

8. The DFE as recited in claim 2, further comprising:
four CS secondary latches, each of the secondary latches including a respective differential pair of n-channel output transistors; and
four secondary taps,
wherein two of the four CS secondary latches are driven by the complementary in-phase ¼-rate clocks and the other two of the four CS secondary latches are driven by the complementary quadrature ¼-rate clocks, and
wherein each secondary tap includes a respective differential pair of p-channel input transistors connected via their gate nodes to a respective one of the four CS secondary latches.

9. The DFE as recited in claim 8, wherein for each secondary tap the respective differential pair of p-channel input transistors are connected via their drain nodes to a differential representation of a bit value provided by a respective one of the four input data streams.

10. The DFE as recited in claim 8, wherein for each secondary tap the respective differential pair of p-channel input transistors are connected via their drain nodes to a different respective one of the four CS primary latches.

11. A decision feedback equalizer (DFE) comprising:
four charge-steering (CS) primary latches, each of the primary latches including a respective differential pair of p-channel input transistors; and
four primary taps,
wherein two of the four CS primary latches are driven by complementary in-phase ¼-rate clocks and the other two of the four CS primary latches are driven by complementary quadrature ¼-rate clocks,
wherein each primary tap includes a respective differential pair of n-channel output transistors connected via their gate nodes to a respective one of the four CS primary latches, and
wherein no element of the DFE is driven by any ½-rate clock.

12. The DFE as recited in claim 11, further comprising:
four circuits to demultiplex an input data stream into four input data streams such that the first input data stream overlaps the second input data stream by 50%, the second input data stream overlaps the third input data stream by 50%, the third input data stream overlaps the fourth input data stream by 50%, and the fourth input data stream overlaps the first input data stream by 50%.

13. The DFE as recited in claim 12, wherein each of the four circuits is a simple switch driven by a respective one of the ¼-rate clocks.

14. The DFE as recited in claim 12, wherein each of the four circuits is a track-and-hold circuit.

15. The DFE as recited in claim 12, wherein for each primary tap the respective differential pair of n-channel output transistors are connected via their source nodes to a differential representation of a bit value provided by a respective one of the four input data streams.

16. The DFE as recited in claim 11, wherein for each primary tap the respective differential pair of n-channel output transistors are connected via their source nodes to a different respective one of the four CS primary latches.

17. The DFE as recited in claim 11, wherein every switch of at least one of the primary taps is driven by one of the ¼-rate clocks.

18. The DFE as recited in claim 12, further comprising:
four CS secondary latches, each of the secondary latches including a respective differential pair of p-channel input transistors; and
four secondary taps,
wherein two of the four CS secondary latches are driven by the complementary in-phase ¼-rate clocks and the other two of the four CS secondary latches are driven by the complementary quadrature ¼-rate clocks, and
wherein each secondary tap includes a respective differential pair of n-channel output transistors connected via their gate nodes to a respective one of the four CS secondary latches.

19. The DFE as recited in claim 18, wherein for each secondary tap the respective differential pair of n-channel output transistors are connected via their source nodes to a differential representation of a bit value provided by a respective one of the four input data streams.

20. The DFE as recited in claim 18, wherein for each secondary tap the respective differential pair of n-channel output transistors are connected via their source nodes to a different respective one of the four CS primary latches.

* * * * *